United States Patent
Suzuki et al.

(10) Patent No.: US 6,652,709 B1
(45) Date of Patent: Nov. 25, 2003

(54) PLASMA PROCESSING APPARATUS HAVING CIRCULAR WAVEGUIDE, AND PLASMA PROCESSING METHOD

(75) Inventors: Nobumasa Suzuki, Yokohama (JP); Shigenobu Yokoshima, Ohta-ku (JP)

(73) Assignee: Canon Kabushiki Kaisha, Tokyo (JP)

( * ) Notice: Subject to any disclaimer, the term of this patent is extended or adjusted under 35 U.S.C. 154(b) by 20 days.

(21) Appl. No.: 09/697,124

(22) Filed: Oct. 27, 2000

(30) Foreign Application Priority Data

Nov. 2, 1999 (JP) ............................................ 11-312903
Mar. 3, 2000 (JP) ........................................ 2000-059019
Apr. 26, 2000 (JP) ....................................... 2000-125792

(51) Int. Cl.[7] .......................... H05H 1/00; C23C 16/00; H01L 21/00
(52) U.S. Cl. ......................... 156/345.41; 118/723 MW; 315/111.21
(58) Field of Search ....................... 156/345.41, 345.42, 156/345.36; 118/723 MW, 723 MR, 723 ME, 723 MA, 723 AN; 315/111.21, 111.41

(56) References Cited

U.S. PATENT DOCUMENTS

| | | | |
|---|---|---|---|
| 5,144,199 A | * | 9/1992 | Taki et al. ................... 313/484 |
| 5,359,177 A | * | 10/1994 | Taki et al. ............. 219/121.43 |
| 5,538,699 A | | 7/1996 | Suzuki ................... 422/186.29 |
| 5,645,644 A | * | 7/1997 | Mabuchi et al. ...... 118/723 WE |
| 5,788,798 A | * | 8/1998 | Mabuchi et al. ............ 156/345 |
| 5,803,975 A | | 9/1998 | Suzuki ....................... 118/723 |
| 5,874,706 A | * | 2/1999 | Ishii et al. ............. 219/121.43 |
| 6,080,679 A | | 6/2000 | Suzuki ....................... 438/726 |
| 6,290,807 B1 | * | 9/2001 | Matsumoto et al. ........ 156/345 |

FOREIGN PATENT DOCUMENTS

| | | | | |
|---|---|---|---|---|
| EP | 0564359 B1 | * | 4/1996 | ............ H05H/1/46 |
| EP | 0880164 A1 | * | 11/1998 | ............ H01J/37/32 |
| EP | 1189493 A2 | * | 3/2002 | ............ H05H/1/46 |
| JP | 62-298106 A | * | 12/1987 | ......... H01L/21/205 |
| JP | 63-80522 A | * | 4/1988 | ......... H01L/21/205 |
| JP | 10-126101 A | * | 5/1998 | ............. H01P/1/16 |
| JP | 10-233295 | | 9/1998 | |
| JP | 11-40397 A | * | 2/1999 | ............ H05H/1/46 |
| JP | 11-40549 A | * | 2/1999 | ....... H01L/21/3065 |
| JP | 2001-250778 A | * | 9/2001 | ......... H01L/21/205 |

OTHER PUBLICATIONS

US patent application Publication No. 2001/0054605 A1. pub, date Dec. 27, 2001, Suzuki et al, Appli. No. 09/816,359 Filed Mar. 26, 2001.*

* cited by examiner

Primary Examiner—Parviz Hassanzadeh
(74) Attorney, Agent, or Firm—Fitzpatrick, Cella, Harper & Scinto

(57) ABSTRACT

In order to keep the balance of microwave plasma density to suppress uneven processing in the circumferential direction of a circular waveguide, in a plasma processing apparatus comprising a plasma generation chamber, a support means for supporting an article, a gas introducing means, and an evacuation means, two introducing ports are provided in a microwave applicator for supplying microwaves through a dielectric window, and microwaves distributed with a junction circuit are guided to the introducing ports such that electric field vectors are in predetermined directions.

1 Claim, 13 Drawing Sheets

PLASMA PROCESSING APPARATUS HAVING CIRCULAR WAVEGUIDE, AND PLASMA PROCESSING METHOD

BACKGROUND OF THE INVENTION

1. Field of the Invention

The present invention relates to a plasma processing apparatus and a plasma processing method, and more particularly to a microwave plasma processing apparatus and method utilizing an improved system for introducing microwaves.

2. Related Background Art

As plasma processing apparatuses that use microwaves as an excitation source for plasma generation, there have been known the etching apparatus, the ashing apparatus, the CVD apparatus, the doping apparatus, the cleaning apparatus, the surface modifying apparatus and the like that are used for producing semiconductor devices.

The etching of an article to be processed (hereinafter, simply referred to as "article" as occasion demands) using a microwave plasma etching apparatus is carried out, for example, as follows. An etchant gas is introduced into a plasma generation chamber of the microwave plasma etching apparatus, and a microwave energy is simultaneously introduced therein to excite and decompose the etchant gas, thereby etching a surface of the article.

Furthermore, the ashing of an article using a microwave plasma ashing apparatus is carried out, for example, as follows. An ashing gas is introduced into a plasma generation chamber of the microwave plasma ashing apparatus, and a microwave energy is simultaneously introduced thereinto to excite and decompose the ashing gas, thereby ashing an organic matter such as a photoresist, etc. existing on a surface of the article.

Moreover, the film formation on an article using a microwave plasma CVD apparatus is carried out, for example, as follows. A reactive gas is introduced into a plasma generation chamber of a microwave plasma CVD apparatus, and a microwave energy is simultaneously introduced thereinto to excite and decompose the reactive gas, thereby forming a deposited film on the article.

In addition, the doping of an article using a microwave plasma doping apparatus is carried out, for example, as follows. A doping gas is introduced into a plasma generation chamber of the microwave plasma doping apparatus, and a microwave energy is simultaneously introduced therein to excite and decompose the doping gas, thereby doping a surface of the article.

With the microwave plasma processing apparatus, since microwaves of a high frequency are used as a gas excitation source, the number of electron accelerations is increased to increase the electron density, thereby efficiently ionizing and exciting gas molecules. Thus, the microwave plasma processing apparatus is advantageous in that the efficiency of ionization, excitation, and decomposition of a gas are high, so that it is possible to carry out fast, high quality processing even at a low temperature. In addition, there is a further advantage that the microwaves have a property of penetrating a dielectric, so that the plasma processing apparatus can be constituted as an electrodeless discharge type one, whereby highly clean plasma processing can be carried out.

As an example of a microwave plasma processing apparatus, there has recently been proposed an apparatus that uses an endless circular (or annular) waveguide having a plurality of linear slots radially formed in a planar H-place, as an apparatus for uniformly introducing microwaves efficiently (Japanese Patent Application Laid-Open No. 10-233295).

This microwave plasma processing apparatus is shown in FIG. 17. In the figure, reference numeral 9 designates a plasma generation chamber; W an article; 2 a support means for the article W; 11 a means for adjusting the temperature of the article; 122 a high frequency bias applying means; 7 a processing gas introducing means; 8 an evacuation means; 4 a dielectric window for separating the plasma generation chamber 9 from the atmosphere; 3 a microwave applicator with slots 23 for introducing microwaves through the dielectric window 4 into the plasma generation chamber 9; 13 an endless circular (or annular) waveguide; and 25 is an introducing port for introducing microwaves into the endless circular waveguide 13 to distribute them in the clockwise and the counterclockwise directions.

The generation of a plasma and the processing are carried out as follows. The inside of the plasma generation chamber 9 is evacuated via the evacuation means 8. Subsequently, a plasma processing gas is introduced at a predetermined flow rate into the plasma generation chamber 9 via the processing gas introducing means 7. Then, the inside of the plasma generation chamber 9 is kept at a predetermined pressure. If necessary, a bias voltage is applied to the article W with the high frequency bias applying means 122. A desired power from a microwave power source is supplied into the plasma generation chamber 9 through the endless circular waveguide 13. At this time, microwaves introduced into the endless circular waveguide 13 are distributed into two at the introducing port 25 and propagate within the waveguide 13 at a guide wavelength longer than the wavelength in the free space. The distributed microwaves interfere with each other to generate standing waves having a node or loop at every ½ of the guide wavelength. Microwaves introduced into the plasma generation chamber 9 through the dielectric window 4 from the slots 23 provided at such positions as to maximize the electric field, i.e., at the center of the endless circular waveguide 13 between adjoining two loops of standing waves generate a plasma in the vicinity of the slots 23. When the electron plasma frequency of the generated plasma exceeds the power source frequency (for example, when the electron plasma frequency exceeds the power source frequency of 2.45 GHz in the case where the electron density exceeds $7 \times 10^{10}$ cm$^{-3}$), the so-called cut-off in which microwaves cannot propagate through the plasma is caused. Further, when the electron density increases and the depth of penetration δ defined by the following equation 1 becomes sufficiently small, microwaves propagate in a surface of the dielectric window 4.

$$\delta = (2/\omega\mu_o\sigma)^{1/2} \qquad \text{(Equation 1)}$$

In the equation, ω is the angular frequency of a power source, $\mu_o$ is the space permeability, and σ is the plasma conductivity (for example, when the electron density is $2 \times 10^{12}$ cm$^{-3}$ or more, and when the depth of penetration is 3 mm or less, microwaves propagate as surface waves in a surface of the dielectric window 4). Surface waves introduced via adjoining slots 23 interfere with each other to generate surface standing waves whose loops are at every half wavelength of surface waves approximately defined by the following equation 2.

$$\lambda_s = \lambda_o / \epsilon_r^{-1/2} \qquad \text{(Equation 2)}$$

In the equation, $\lambda_o$ is the free-space microwave wavelength, and $\epsilon_r$ is the dielectric constant of the dielectric window.

The surface standing waves leaked to the plasma generation chamber 9 accelerate electrons, thus generating a surface-wave interfered plasma (SIP). At this time, when a processing gas is introduced into the plasma generation chamber 9, the processing gas is excited by the thus generated high density plasma to process a surface of the article W placed on the support means 2.

The use of such a microwave plasma processing apparatus can generate a high density, low electron temperature plasma of a uniformity within ±3%, an electron density $2\times10^{12} cm^{-3}$ or more, an electron temperature 3 eV or less, and a plasma potential 15 V or less in a space with a large aperture of a diameter of 300 mm or more under the conditions of a pressure of 1.3 Pa and a microwave power of 3 kW. Thus, since the gas can fully be reacted and supplied in an active state to the article, and since article surface damage due to incident ions or charge-up can be reduced, high quality, high speed processing can be attained.

Further, under a high pressure condition of about 133 Pa such as adopted in the ashing or the like, since a plasma of a high density of $1\times10^{13}$ $cm^{-3}$ or more is locally generated in the vicinity of the dielectric window 4, high speed, very low damage processing can be attained.

However, when the microwave plasma processing apparatus such as shown in FIG. 17 that generates a high density, low electron temperature plasma is used to carry out processing, there are instances depending on the conditions where the balance of plasma density between the microwave introducing port 25 and a portion 26 opposite thereto is lost to cause uneven processing in the circumferential direction.

SUMMARY OF THE INVENTION

A main object of the present invention is to provide a plasma processing apparatus and a plasma processing method that can keep the balance of plasma density between the microwave introducing port and the opposite portion and can generate a high density, low electron temperature plasma, so that high quality processing can uniformly be effected at a higher rate. According to a first aspect of the present invention, there is provided a plasma processing apparatus comprising a plasma generation chamber, a support means for supporting an article, a gas introducing means for introducing a gas into the plasma generation chamber, an evacuation means for evacuating the plasma generation chamber, a microwave applicator comprising an endless circular waveguide having a plurality of microwave introducing ports and a plurality of slots, for supplying microwaves into the plasma generation chamber, and a junction means comprising an inlet for microwaves and a plurality of outlets for microwaves connected to the plurality of microwave introducing ports of the circular waveguide.

According to a second aspect of the present invention, there is provided a plasma processing method comprising the steps of introducing a gas into a plasma generation chamber and supplying microwaves into the plasma generation chamber through an endless circular waveguide, thereby plasma-processing an article, wherein the microwaves are distributed into a plurality, then introduced into a common endless circular waveguide from a plurality of introducing ports, and supplied to the plasma generation chamber via a slot formed in the common endless circular waveguide.

According to a third aspect of the present invention, there is provided a plasma processing apparatus comprising a plasma generation chamber, a support means for supporting an article, a gas introducing means for introducing a gas into the plasma generation chamber, an evacuation means for evacuating the plasma generation chamber, a microwave applicator for supplying microwaves into the plasma generation chamber, the microwave applicator comprising an endless circular waveguide having a plurality of microwave introducing ports and a plurality of slots, and a junction means having a plurality of outlets for microwaves connected to the plurality of microwave introducing ports and an inlet for microwaves, wherein microwaves are introduced such that the electric field vectors of the microwaves are in directions opposite to each other at the microwave introducing ports.

According to a fourth aspect of the present invention, there is provided a plasma processing method comprising the steps of placing an article in a plasma generation chamber, introducing a gas into the plasma generation chamber and supplying microwaves into the plasma generation chamber through an endless circular waveguide, thereby plasma-processing the article, wherein the microwaves are distributed so as to divide the incidence direction thereof into two and are supplied into the circular waveguide such that the electric field vectors of the microwaves are in directions opposite to each other at microwave introducing ports.

According to a fifth aspect of the present invention, there is provided a plasma processing apparatus comprising a plasma generation chamber, a support means for supporting an article, a gas introducing means for introducing a gas into the plasma generation chamber, an evacuation means for evacuating the plasma generation chamber, and a microwave applicator for supplying microwaves into the plasma generation chamber, the microwave applicator comprising a circular waveguide with a plurality of slots, at least two introducing ports provided in the circular waveguide, and an E-plane junction for introducing microwaves into the introducing ports such that the electric field vectors are in directions opposite to each other.

According to a sixth aspect of the present invention, there is provided a plasma processing method which uses a plasma processing apparatus comprising a plasma generation chamber, a support means for supporting an article, a gas introducing means for introducing a gas into the plasma generation chamber, an evacuation means for evacuating the plasma generation chamber, and a microwave applicator for supplying microwaves into the plasma generation chamber, the method comprising introducing microwaves distributed by use of an E-plane junction into at least two introducing ports such that the electric field vectors are in directions opposite to each other, and supplying microwaves introduced from the introducing ports into the plasma generation chamber through a slot provided in a circular waveguide, thereby processing an article.

According to a seventh aspect of the present invention, there is provided a plasma processing apparatus comprising a plasma generation chamber, a support means for supporting an article, a gas introducing means for introducing a gas into the plasma generation chamber, an evacuation means for evacuating the plasma generation chamber, and a microwave applicator for supplying microwaves into the plasma generation chamber, the microwave applicator comprising a circular waveguide with a plurality of slots, at least two introducing ports provided in the circular waveguide, and an H-plane junction for introducing microwaves into the introducing ports such that the electric field vectors are in directions equal to each other.

According to an eighth aspect of the present invention, there is provided a plasma processing method which uses a plasma processing apparatus comprising a plasma generation chamber, a support means for supporting an article, a gas introducing means for introducing a gas into the plasma generation chamber, an evacuation means for evacuating the plasma generation chamber, and a microwave applicator for supplying microwaves into the plasma generation chamber, the method comprising introducing microwaves distributed by use of an H-plane junction into at least two introducing ports such that the electric field vectors are in directions equal to each other, and supplying microwaves introduced from the introducing ports into the plasma generation chamber through a slot provided in a circular waveguide, thereby processing an article.

DETAILED DESCRIPTION OF THE PREFERRED EMBODIMENTS

Preferred embodiments of the present invention will be described below in detail with reference to the attached drawings.

Figure 1:
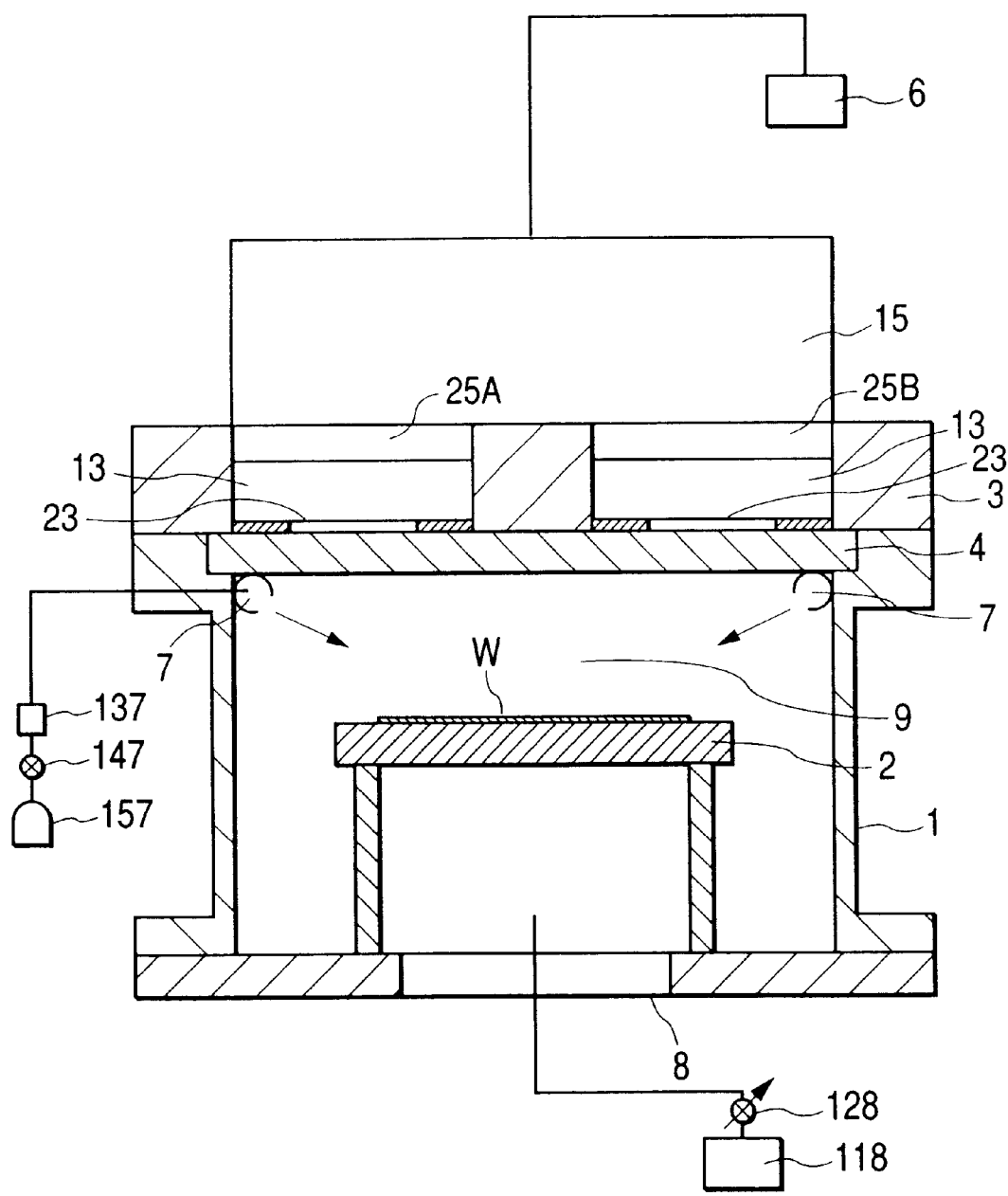
FIG. 1 is a schematic sectional view showing a plasma processing apparatus according to the present invention.

FIG. 1 is a schematic sectional view showing a microwave plasma processing apparatus according to a preferred embodiment of the present invention.

In the figure, reference numeral 1 designates a vessel having a plasma generation chamber 9 inside thereof; 4 a dielectric for separating the plasma generation chamber 9 from the atmosphere; 3 a microwave applicator for supplying microwaves into the plasma generation chamber 9; 15 a junction circuit for introducing microwaves into a plurality of introducing ports 25A, 25B of a circular waveguide 13 of the microwave applicator 3; 2 a support means for supporting an article W; 7 a gas introducing means for a processing gas; and 8 an evacuation means.

Figure 2:
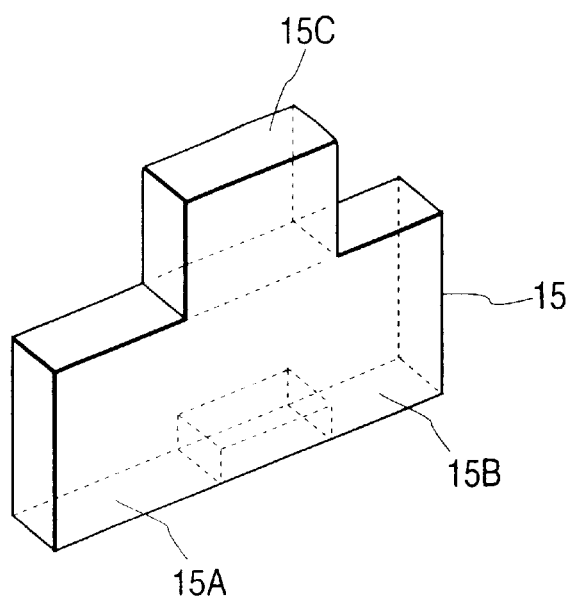
FIG. 2 is a schematic perspective view showing a junction circuit used in the present invention.

FIG. 2 is a schematic view illustrating a junction circuit 15 used in the present invention.

The junction circuit 15 has an inlet 15C for microwaves to be connected to a microwave power source and outlets 15A, 15B for microwaves. The outlets 15A, 15B for microwaves are connected to the microwave introducing ports 25A, 25B of the microwave applicator 3, respectively.

Microwaves introduced from the inlet 15C are distributed in two directions and travel to the respective outlets 15A, 15B.

Figure 3:
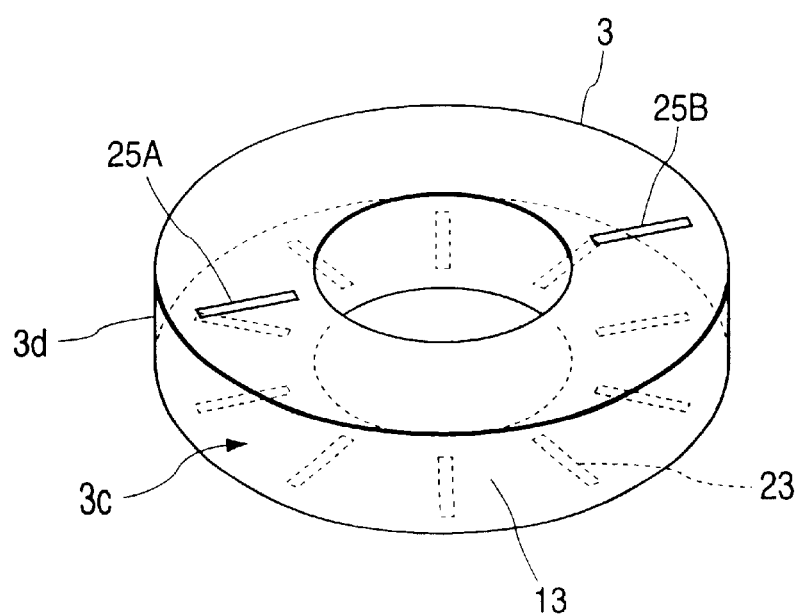
FIG. 3 is a schematic perspective view showing a microwave applicator used in the present invention.

FIG. 3 is a schematic perspective view showing a microwave applicator used in the present invention.

The microwave applicator 3 is internally provided with an endless circular waveguide 13 and is further provided with a plurality of slots 23 on the plasma generation chamber 9 side. In a surface opposite to a flat surface 3C with the slots 23 are provided a pair of microwave introducing ports 25A, 25B.

The circular waveguide 13 has no end surface in the circumferential direction thereof. Therefore, assuming that microwaves introduced into the circular waveguide 13 continue propagating without any loss in the circumferential direction, if the circumferential length of the circular waveguide, which is the length of an annulus formed by connecting the centers of cross sections of the circular waveguide together, is an integral multiple of the wavelength of the microwaves propagating within the waveguide, the microwaves cause resonance to generate standing waves. Actually, since the microwaves will partly leak out from the slots 23, the introduced microwaves will propagate while being attenuated to cause resonance, thus generating standing waves. If only one introducing port is provided, there are cases where the strength of microwaves becomes small at a side opposite to the introducing port provided side. Therefore, in the present embodiment, a pair of introducing ports 25A, 25B are provided to supplement the attenuation.

Figure 4A:
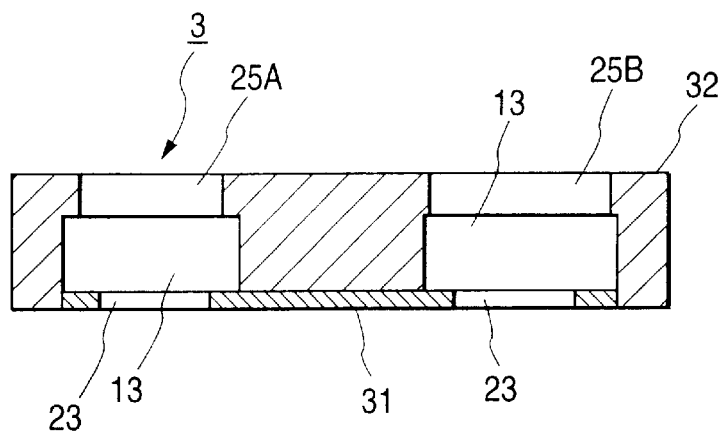
FIGS. 4A, 4B and 4C are schematic views for illustrating the structure of a microwave applicator used in the present invention.
Figure 4B:
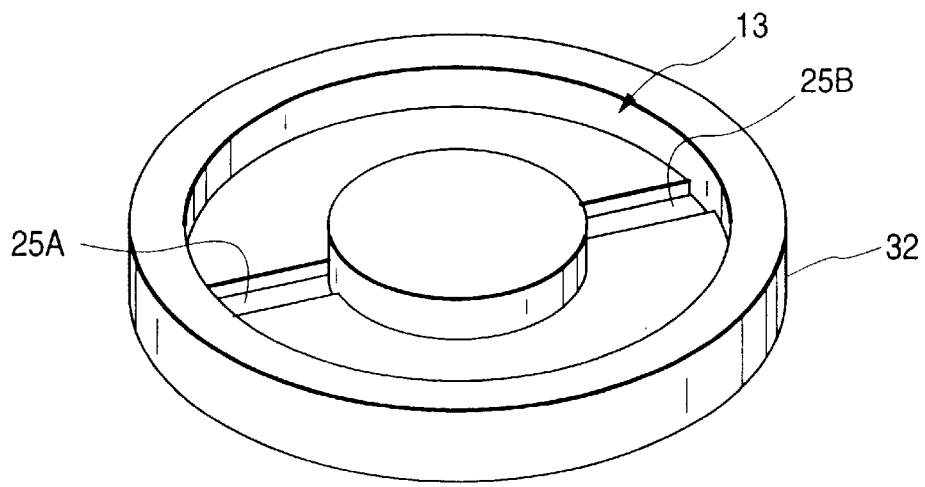
Figure 4C:
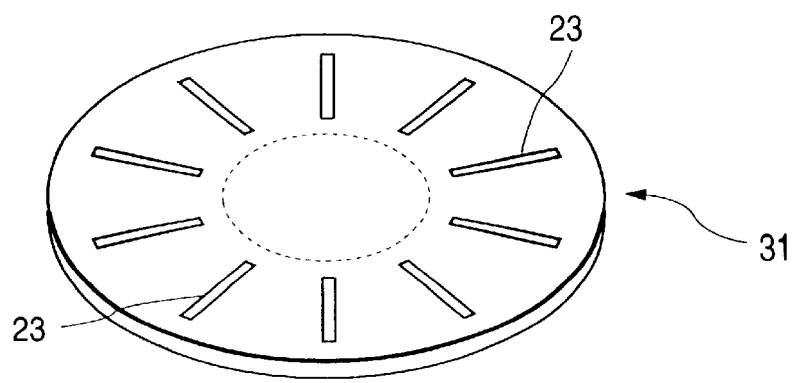

FIGS. 4A to 4C illustrates an example of a microwave applicator used in the present invention, and more specifically FIG. 4A is a schematic sectional view of the microwave applicator, and FIGS. 4B and 4C are perspective views showing components thereof.

The microwave applicator shown in FIG. 4A is an assembly mainly composed of a conductive member 32 with a circular recess shown in FIG. 4B, and a conductive flat plate 31 with slots 23 shown in FIG. 4C. The circular recess of the conductive member 32 forms the endless circular waveguide 13, and two openings of the conductive member 32 forms the introducing ports 25A, 25B.

Endless circular waveguides are described in, e.g., U.S. Pat. No. 5,538,699, and Japanese Patent Application Laid-Open Nos. 7-90591, 11-40397, and 11-40549.

FIGS. 5A to 5D are schematic views for illustrating the manner of introducing microwaves according to the present invention.

Figure 5A:
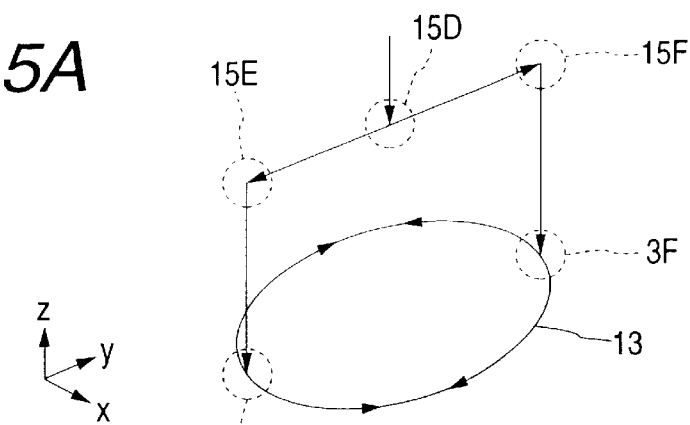
FIGS. 5A, 5B, 5C and 5D are schematic views for illustrating microwave introducing routes according to the present invention.

FIG. 5A shows an example of microwave introducing route (propagation route) in which microwaves introduced in the z-axis direction from the inlet of the junction circuit are distributed into two in the y-axis direction at a junction 15D and change the courses in the z-axis direction at two corner portions 15E, 15F, respectively. Subsequently, they are each distributed into two in the clockwise and the counterclockwise directions at two microwave introducing port portions 3E and 3F of the circular waveguide 13 to travel and propagate in the xy-plane.

Figure 5B:
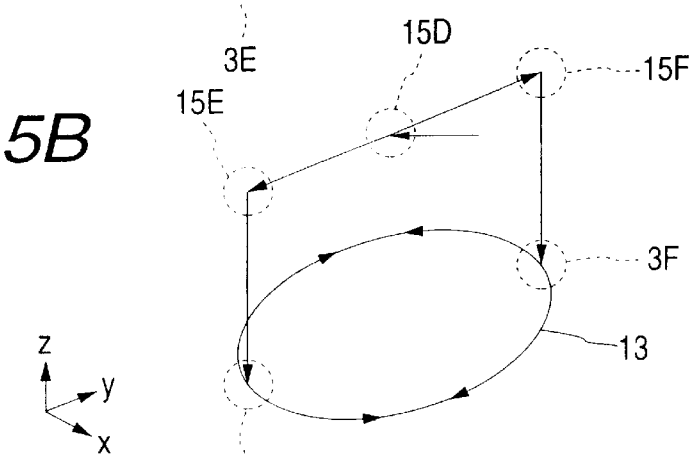

FIG. 5B shows another example of microwave introducing route in which microwaves introduced in the x-axis direction from the inlet of the junction circuit are distributed into two in the y-axis direction at the junction 15D and change the courses in the z-axis direction at the two corner portions 15E, 15F, respectively. Subsequently, they are each distributed into two in the clockwise and the counterclockwise directions at the two microwave introducing port portions 3E and 3F of the circular waveguide 13 to travel and propagate in the xy-plane.

Figure 5C:
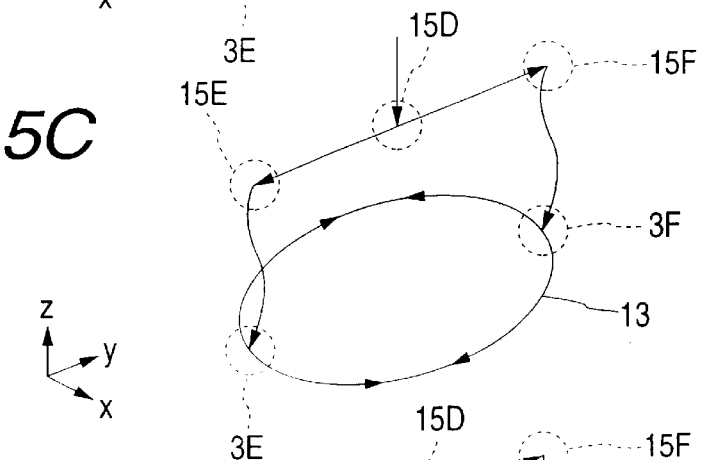

FIG. 5C shows the microwave introducing route of a modification of the example shown in FIG. 5A in which microwaves as distributed in the y-axis direction at the junction 15D change their courses in the z-axis direction at the two corner portions 15E, 15F, then have their electric field vector directions changed by ±90° and are introduced into the microwave introducing ports of the circular waveguide.

The example of FIG. 5C may further be modified such that microwaves are introduced into the inlet of the junction circuit in the x-axis direction as is the case with the example of FIG. 5B.

Figure 5D:
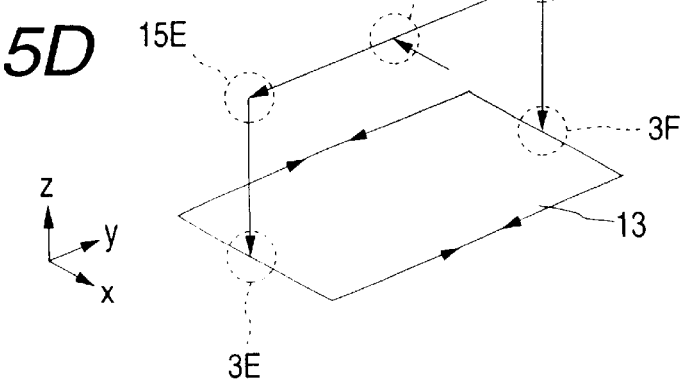

FIG. 5D shows a modification of the example of FIG. 5B, which is different from the example of FIG. 5B only in that the endless circular waveguide 13 is rectangular. Thus, the circular waveguide used in the present invention may be in the shape of a circle, ellipsoid, square, polygon, or the like.

In the above described examples, at the three junction portions 15D, 3E, 3F and the two corner portions 15E, 15F, for attaining impedance matching, the inner surface may be tapered, or an E or H bend may be used for the corner portions 15E, 15F.

The shape of the junction portions 15D used for the present microwave plasma processing apparatus may be a simple H-plane T junction when the circumferential length of the circular waveguide is an odd multiple of the guide wavelength of microwaves and two introducing ports are provided every 180°. When the circumferential length of the circular waveguide is an even multiple of the guide wavelength of microwaves, it is preferable to effect phase lead by 180° of the microwaves introduced into one of the introducing ports by use of a phase shifter, etc.

As described below, when an E-plane T junction is used for the junction portion 15D, since the phases of microwaves are shifted by 180° with regard to each other at the introducing ports of the circular waveguide, it is preferably used when the circumferential length of the circular waveguide is an even multiple of the guide wavelength of microwaves.

In the present invention, if necessary, a plasma generation chamber for plasma generation and a processing chamber for placing an article W therein may be separately provided.

The inside of the waveguide 13 used in the microwave plasma processing apparatus of the present invention may be filled with a dielectric material or the atmosphere or may be evacuated, but it is preferred that the circumferential length thereof is an integral multiple of the guide wavelength of microwaves.

The shape of the slots 23 used in the present invention may be a rectangular perforation having a length of about ¼ of the guide wavelength, and a plurality of rectangular perforations arranged discontinuously in a line are also applicable. Further, the slots may have a curved shape.

Moreover, the slots may be arranged such that a center in the longitudinal direction of the slot is offset inside or outside with regard to a center of the circular waveguide (i.e., a center of a rectangular cross section).

In addition, it is preferred that an interval between at least a pair of adjoining slots in the circumferential direction of the circular waveguide is ¼ or ½ of the guide wavelength or an integral multiple thereof, but an interval between adjoining slots of a part of all the slots may be different from an interval of adjoining slots of the other slots by, e.g., omitting a slot at a portion confronting the introducing port for microwaves.

It is preferable that the slots are arranged so as to be in line symmetry with regard to a line connecting the two microwave introducing ports 25A, 25B.

As the material of the microwave applicator 3 used in the microwave plasma processing apparatus according to the present invention, any conductor may be used, but an optimal material is stainless steel plated with Al, Cu, or Ag/Cu that has a high conductivity in order to minimize the propagation loss of microwaves.

The frequency of microwaves used in the microwave plasma processing apparatus and method according to the present invention may suitably be selected within the range of 0.8 GHz to 20 GHz.

As the dielectric 4 used in the microwave plasma processing apparatus and method according to the present invention, there can preferably be included $SiO_2$-based quartz glass, other type of glass, inorganic substances such as $Al_2O_3$, AlN, $Si_3N_4$, NaCl, KCl, LiF, $CaF_2$, $BaF_2$, MgO, etc., but films or sheets of organic substances such as polyethylene, polyester, polycarbonate, cellulose acetate, polypropylene, polyvinyl chloride, polyvinylidene chloride, polystyrene, polyamide, polyimide, polytetrafluoroethylene, etc. are also applicable.

In the present microwave plasma processing apparatus and method, a magnetic field generating means may be used as the occasion demands. As the magnetic field used in the present plasma processing apparatus and method, although the mirror magnetic field is applicable, the magnetron magnetic field is optimal in which the magnetic field is parallel to the longitudinal direction of the slots, i.e., the magnetic field is perpendicular to the electric field of the slots, and the magnetic flux density in the vicinity of the slots is 100 times or more greater than the magnetic flux density in the vicinity of an article. Although other magnetic field generating means than coils may be used, a permanent magnet is optimal which can apply a magnetic field locally existing in the vicinity of the dielectric window. When a coil is used, water cooling mechanism or other cooling means such as an air-cooling mechanism may be additionally provided to prevent overheating. Moreover, in order to further improve the quality of the processing, a surface of the article may be irradiated with ultraviolet light.

As the light source, it is possible to use those which radiate a light that is absorbed by the article W or a gas adhering to the article W, and it is appropriate to use excimer lasers and lamps, rare gas resonance line lamps, low-pressure mercury lamps, and the like.

The generation of a plasma and the processing using the above described plasma processing apparatus are carried out as follows.

First, the inside of the vessel 1 is evacuated via an evacuation system (118, 128). Subsequently, a plasma processing gas is introduced at a predetermined flow rate into the vessel 1 via a gas emission opening of the gas introducing means 7 from a gas supply system (137, 147, 157).

Then, a conductance valve 128 provided in the evacuation system (118, 128) is adjusted to maintain the inside of the vessel 1 at a predetermined pressure. A desired power from a microwave power source 6 is introduced into the vessel 1 through the slots 23 of the microwave applicator 3 to generate a plasma in the plasma generation chamber 9. At this time, since the plasma processing gas is being introduced into the plasma generation chamber 9 via the introducing means 7 for the processing gas, the processing gas is activated by a high density plasma as generated to form ions, atoms, electrons, neutral radicals, etc., thus processing a surface of the article W put on the holding means 2.

The pressure inside the plasma generation chamber during plasma processing in the present microwave plasma processing method may be selected within the range of 0.01 Pa to 1400 Pa, more preferably $1.33 \times 10^{-2}$ Pa to $1.33 \times 10^3$ Pa, more specifically within the range of 0.1 Pa to 70 Pa, more preferably $1.33 \times 1^{-1}$ Pa to 13.3 Pa in the case of CVD; 0.06 Pa to 7 Pa, more preferably $6.65 \times 10^{-2}$ Pa to 6.65 Pa in the case of etching; and 10 Pa to 1400 Pa, more preferably 13.3 Pa to $1.33 \times 10^3$ Pa in the case of ashing.

In formation of a deposited film according to the present microwave plasma processing method, suitable selection of the gases used enables efficient formation of various deposited films such as an insulating film of $Si_3N_4$, $SiO_2$, $Ta_2O_5$, $TiO_2$, TiN, $Al_2O_3$, AlN, $MgF_2$, etc.; a semiconductor film of a-Si (amorphous silicon), poly-Si (polysilicon), SiC, GaAs, etc.; and a metal film of Al, W, Mo, Ti, Ta, etc.

The article (also referred to as "substrate") W to be processed by the present plasma processing method may be semiconducting, conductive or insulating. Further, the article W may have a resist or the like on a surface thereof.

As the conductive substrate, there can be included metals such as Fe, Ni, Cr, Al, Mo, Au, Nb, Ta, V, Ti, Pt, Pb, etc., and alloys thereof such as brass, stainless steel, etc.

As the insulating substrate, there can be included $SiO_2$-based quartz glass and other glass; inorganic substances such as $Si_3N_4$, NaCl, KCl, LiF, $CaF_2$, $BaF_2$, $Al_2O_3$, AlN, MgO, etc.; and films or sheets of organic substances such as polyethylene, polyester, polycarbonate, cellulose acetate, polypropylene, polyvinyl chloride, polyvinylidene chloride, polystyrene, polyamide, polyimide, etc.

As the gases used in the case of forming a thin film on a substrate by the CVD process, generally known gases can be used.

When a thin film of an Si-based semiconductor such as a-Si, poly-Si, or SiC is to be formed, as an Si atom containing source gas to be introduced into the plasma generation chamber 9 through the processing gas introducing means 7, there can be included those which are in a gaseous state at ordinary temperature and pressure or which are gassified easily, for example, inorganic silanes such as $SiH_4$ or $Si_2H_6$; organic silanes such as tetraethylsilane (TES), tetramethylsilane (TMS), dimethylsilane (DMS), dimethyldifluorosilane (DMDFS), or dimethyldichlorosilane (DMDCS); or halosilanes such as $SiF_4$, $Si_2F_6$, $Si_3F_8$, $SiHF_3$, $SiH_2F_2$, $SiCl_4$, $Si_2Cl_6$, $SiHCl_3$, $SiH_2Cl_2$, $SiH_3Cl$, or $SiCl_2F_2$. In addition, as an additional gas or a carrier gas that may be mixed with the Si source gas and introduced, there may be included $H_2$, He, Ne, Ar, Kr, Xe, and Rn.

As the material containing Si atoms (processing gas) used when forming a thin film based on an Si compound such as $Si_3N_4$ or $SiO_2$, the following materials that maintain a gaseous state at ordinary temperature and pressure or that are gassified easily can be used: inorganic silanes such as $SiH_4$ or $Si_2H_6$; organic silanes such as tetraetoxysilane (TEOS), tetrametoxysilane (TMOS), octamethylcyclotetrasilane (OMCTS), dimethyldifluorosilane (DMDFS), or dimethyldichlorosilane (DMDCS); or halosilanes such as $SiF_4$, $Si_2F_6$, $Si_3F_8$, $SiHF_3$, $SiH_2F_2$, $SiCl_4$, $Si_2Cl_6$, $SiHCl_3SiH_2Cl_2$, $SiH_3Cl$, or $SiCl_2F_2$. In addition, as a nitrogen or an oxygen source gas that may be simultaneously introduced, there can be included $N_2$, $NH_3$, $N_2H_4$, hexamethyldisilazane (HMDS), $O_2$, $O_3$, $H_2O$, NO, $N_2O$, $NO_2$, and so on.

The material containing metal atoms (processing gas) which is used to form a thin metal film such as of Al, W, Mo, Ti, Ta, or the like includes organic metals such as trimethyl aluminium (TMAl), triethyl aluminium (TEAl), triisobutyl aluminium (TIBAl), dimethyl aluminium hydride (DMAlH), tungsten carbonyl ($W(CO)_6$), molybdenum carbonyl ($Mo(CO)_6$), trimethyl gallium (TMGa), and triethyl gallium (TEGa); and halogenated metals such as $AlCl_3$, $WF_6$, $TiCl_3$, and $TaCl_5$. In this case, as an additional or carrier gas which may be mixed with the above Si source gas, $H_2$, He, Ne, Ar, Kr, Xe, Rn, and so on may be included.

The material containing metal atoms (processing gas) which is used to form a thin metal compound film such as of $Al_2O_3$, AlN, $Ta_2O_5$, $TiO_2$, TiN, $WO_3$, or the like includes organic metals such as trimethyl aluminium (TMAl), triethyl aluminium (TEAl), triisobutyl aluminium (TIBAl), dimethyl aluminium hydride (DMAlH), tungsten carbonyl ($W(CO)_6$), molybdenum carbonyl ($Mo(CO)_6$), trimethyl gallium (TMGa), and triethyl gallium (TEGa); and halogenated metals such as $AlCl_3$, $WF_6$, $TiCl_3$, and $TaCl_5$. In this case, as an oxygen or a nitrogen source gas that may be simultaneously introduced includes $O_2$, $O_3$, $H_2O$, NO, $N_2O$, $NO_2$, $N_2$, $NH_3$, $N_2H_4$, and hexamethyldisilazane (HMDS).

As the etching gas (processing gas) used when etching an Si-based semiconductor film such as Si, SiC, etc. in a surface of a substrate, there may be included $CF_2Cl_2$, $Cl_2$, $CCl_4$, $CH_2Cl_2$, $C_2Cl_6$, or the like.

As the etching gas (processing gas) used when etching an Si compound film such as $Si_3N_4$, $SiO_2$, various kinds of SOG, etc. in a surface of a substrate, there may be included $F_2$, $CF_4$, $CH_2F_2$, $C_2F_6$, $C_4F_8$, $CF_2Cl_2$, $SF_6$, $NF_3$, $N_2$, $H_2$, $NH_3$, or the like.

As the etching gas (processing gas) used when etching a metal compound film such as $Al_2O_3$, AlN, $Ta_2O_5$, $TiO_2$, TiN, $WO_3$, etc. in a surface of a substrate, there may be included $F_2$, $CF_4$, $CH_2F_2$, $C_2F_6$, $C_4F_8$, $CF_2Cl_2$, $SF_6$, $NF_3$, $Cl_2$, $CCl_4$, $CH_2Cl_2$, $C_2Cl_6$, $N_2$, $H_2$, $NH_3$, or the like.

As the etching gas (processing gas) used when etching a metal film such as Al, Cu, W, Mo, Ti, Ta, etc. in a surface of a substrate, there may be included $CF_2Cl_2$, $Cl_2$, $CCl_4$, $CH_2Cl_2$, $C_2Cl_6$, or the like.

As the etching gas (processing gas) used when etching an organic film such as polyarylether, polyfluorocarbon, polyimide, polyamide, polycarbonate, etc, in a surface of a substrate, there may be included $O_2$, $O_3$, $H_2O$, $H_2$, NO, $N_2O$, $NO_2$, $N_2$, $NH_3$, or the like.

As the ashing gas (processing gas) used when ashing and removing an organic component such as a photoresist on a surface of a substrate, there may be included $O_2$, $O_3$, $H_2O$, $H_2$, NO, $N_2O$, $NO_2$, $N_2$, $NH_3$, and so on.

As the ashing gas (processing gas) used when ashing and removing a cured organic component such as a photoresist subjected to ion implantation on a surface of a substrate, there may be included $O_2$, $O_3$, $H_2O$, $H_2$, NO, $N_2O$, $NO_2$, $N_2$, $NH_3$, $F_2$, $CF_4$, $CH_2F_2$, $C_2F_6$, $C_4F_8$, $CF_2Cl_2$, $SF_6$, $NF_3$, and so on.

In addition, when the present microwave plasma processing apparatus and method is applied to surface modification, appropriate selection of the gas used enables the oxidation or nitration treatment of a substrate or a surface layer consisting of, e. g., Si, Al, Ti, Zn, or Ta or the doping treatment with B, As, or P. Furthermore, the film-forming technique adopted in the present invention can be applied to the cleaning process. In this case, it can be used to cleaning of oxides, organic substances, or heavy metals.

As the oxidizing gas (processing gas) used for surface treatment by oxidation of a substrate, there may be included $O_2$, $O_3$, $H_2O$, NO, $N_2O$, $NO_2$, or the like. In addition, the nitrating gas (processing gas) used for surface treatment by nitration of a substrate includes $N_2$, $NH_3$, $N_2H_4$, and hexamethyldisilazane (HMDS).

As a cleaning gas used when cleaning an organic substance on a surface of a substrate, $O_2$, $O_3$, $H_2O$, $H_2$, NO, $N_2O$, $NO_2$, etc. may be included. In addition, as a cleaning gas used when cleaning an inorganic substance on a surface of a substrate, $F_2$, $CF_4$, $CH_2F_2$, $C_2F_6$, $C_4F_8$, $CF_2Cl_2$, $SF_6$, $NF_3$, or the like may be included.

Specific Embodiments of Plasma Processing Apparatuses

More specific preferred embodiments of the present plasma processing apparatuses will be described below.

Plasma Processing Apparatus 1

A microwave plasma processing apparatus using a circular waveguide having a circumferential length which is three times the guide wavelength (159 mm) and having two introducing ports will be described with reference to FIGS. 6A and 6B.

Figure 6A:
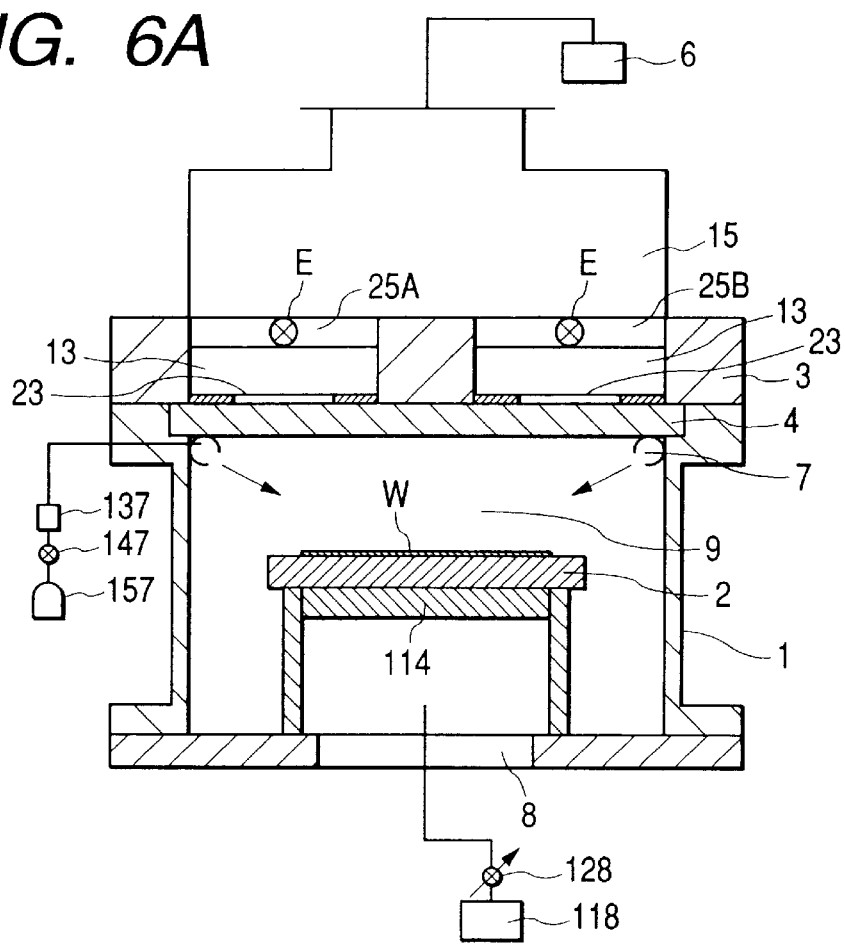
FIGS. 6A and 6B are schematic views showing a plasma processing apparatus in accordance with an embodiment of the present invention.
Figure 6B:
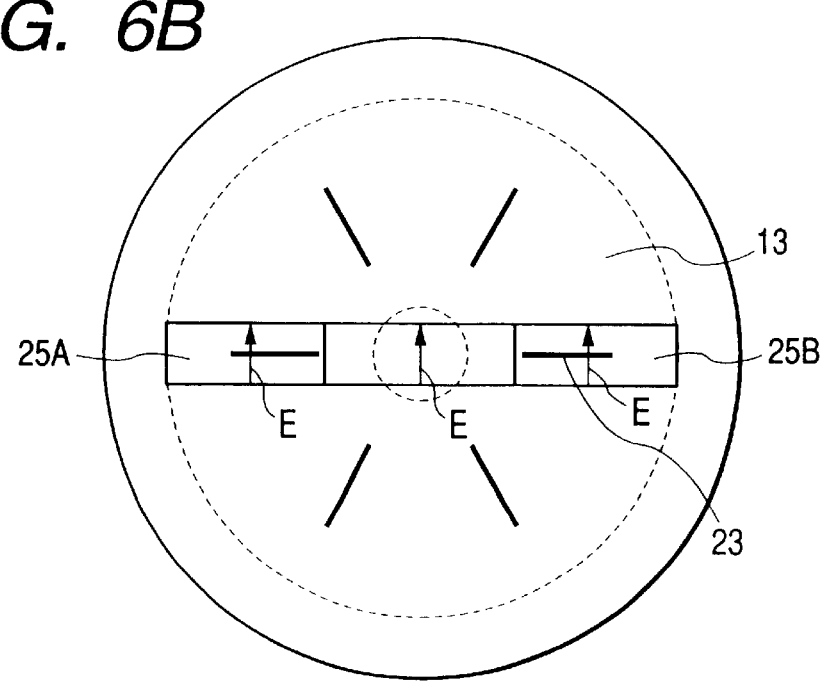

In FIGS. 6A and 6B, reference numeral 1 designates a vessel constituting a plasma generation chamber 9; 4 a dielectric for separating the plasma generation chamber 9 from the atmosphere; 3 a microwave applicator having an endless circular waveguide for introducing microwaves into the plasma generation chamber 9; 15 an H-plane T junction for distributing microwaves into two before introduction; 13 a circular waveguide which forms a microwave propagation space for propagating microwaves; 23 slots for supplying microwaves; 2 a support for supporting an article W; 114 a temperature controlling device having a heater for heating the article W; 7 a gas introducing means for a processing gas; and 8 an evacuation means. E designates electric field vectors, and the directions of electric field vectors at the two introducing ports are the same.

The generation of a plasma and the processing are carried out as follows.

First, the article W is put on the support 2 and is heated to a desired temperature using the temperature controlling device 114. The plasma generation chamber 9 is evacuated via an evacuation opening as the evacuation means 8. Subsequently, a plasma processing gas is introduced at a predetermined flow rate into the plasma generation chamber 9 via the processing gas introducing port 7. Then, a conductance valve 128 provided in the evacuation opening 8 is adjusted to maintain the plasma generation chamber 9 at a predetermined pressure. Microwaves of a desired power from a microwave power source 6 are introduced in $TE_{10}$ mode into the circular waveguide 13 through the junction circuit 15 comprising H-plane T junction. The microwaves are distributed into two at the H-plane T junction, then introduced into the circular waveguide from the two introducing ports, and further distributed by an E-plane junction to propagate in the right and the left directions within the waveguide 13. The microwaves distributed by the E-plane junction interfere with each other at the opposed portions of the respective introducing ports to strengthen the electric field crossing the slot 23 at every ½ of the guide wavelength and introduced into the plasma generation chamber 9 via the slots 23 through the dielectric 4. The electric field of the microwaves introduced into the plasma generation chamber 9 accelerates electrons to generate a plasma in the plasma generation chamber 9. At this time, the processing gas is excited by the generated high density plasma to process the surface of the article W put on the support 2.

Here, the dielectric 4 is made of anhydrous synthetic quartz glass and has a disk-like shape with, e.g., a diameter 299 mm and a thickness 12 mm. The circular waveguide 13 has a 27 mm×96 mm inner wall cross section and a central diameter of 152 mm (with a circumferential length being 3 times the guide wavelength) so as to be suitable for the microwave s propagating in $TE_{10}$ mode. As the material of the microwave applicator 3, Al is used entirely in order to suppress the propagation loss of microwaves.

In an H-plane of the circular waveguide 13, are formed the slots 23 for supplying microwaves into the plasma generation chamber 9. Each slot 23 has a rectangular shape of 42 mm in length and 4 mm in width extending from the inner side surface to the outer side of the waveguide, and six slots are formed in total radially at an interval of ½ of the guide wavelength at an interval of 60°. To the circular waveguide 13, are connected a microwave power source 6 of oscillation frequency 2.45 GHz provided with a 4E tuner, a directional coupler, an isolator, etc. in the mentioned order.

The microwave plasma processing apparatus shown in FIGS. 6A and 6B was used to generate a plasma under the conditions of an Ar flow rate of 500 sccm, pressures of 1.33 Pa and $1.33 \times 10^2$ Pa, and a microwave power of 3.0 kW, and the plasma obtained was measured. The plasma was measured as follows using a single probe method. The voltage applied to the probe was varied within a range of −50 V to +100 V, and a current flowing through the probe was measured by an I-V measuring device. The electron density, the electron temperature and the plasma potential were calculated from the thus obtained I-V curve by the Langmuir method. As a result, the electron density was $2.1 \times 10^{12}$/cm$^3$±2.7% (within $\phi$300 plane) at 1.33 Pa and $9.6 \times 10^{11}$/cm$^3$±5.4% (within $\phi$ 300 plane) at $1.33 \times 10^2$ Pa, and it was confirmed that a plasma having a high plasma density in the vicinity of the center was formed even in the high pressure region. The expression "within $\phi$ 300 plane" means the inside of a circle of 300 mm in diameter.

Plasma Processing Apparatus 2

A microwave plasma processing apparatus using a circular waveguide having a circumferential length which is four times the guide wavelength (159 mm) and having two introducing ports will be described with reference to FIGS. 7A and 7B.

Figure 7A:
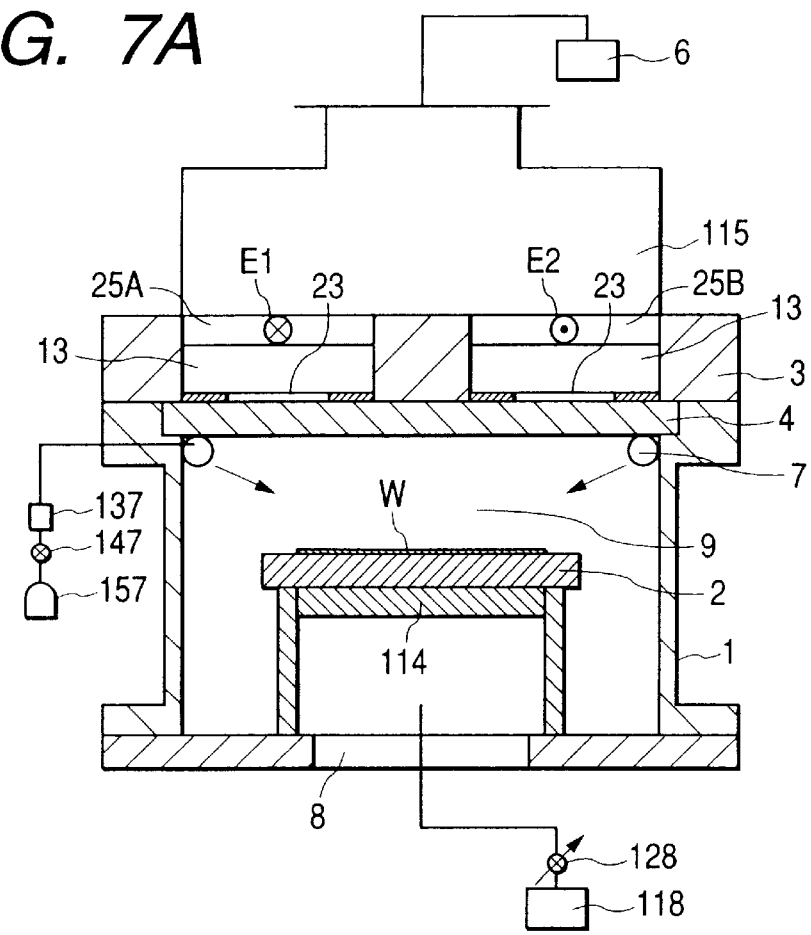
FIGS. 7A and 7B are schematic views showing a plasma processing apparatus in accordance with another embodiment of the present invention.
Figure 7B:
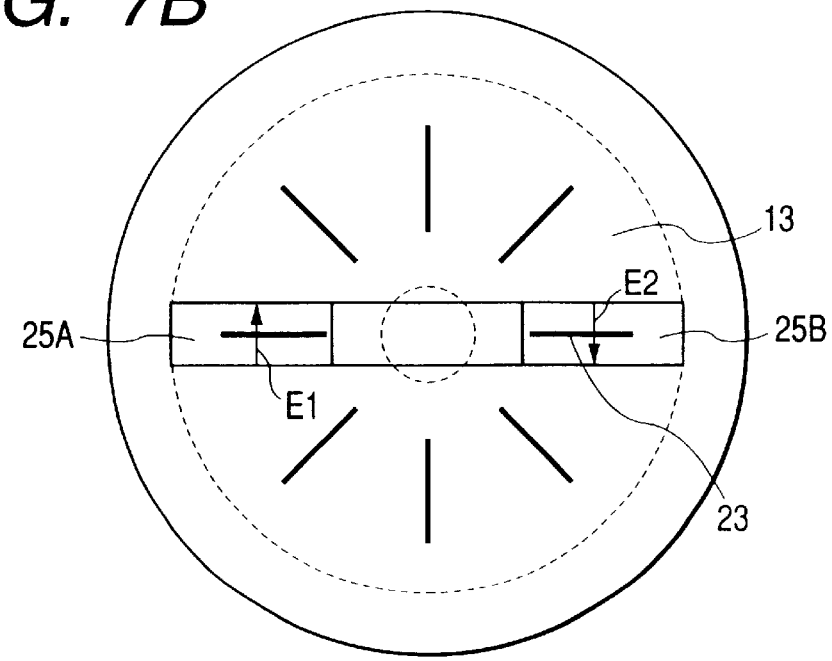

In FIGS. 7A and 7B, reference numeral 9 designates a plasma generation chamber (plasma processing chamber); 4 a dielectric for separating the plasma processing chamber 9 from the atmosphere; 3 a microwave applicator having an endless circular waveguide for introducing microwaves into the plasma processing chamber 9; 115 an H-plane T junction with a phase shifter (not shown) for introducing microwaves into a circular waveguide 13; 23 slots for introducing microwaves into the plasma processing chamber 9 from the circular waveguide 13; 2 a support for supporting an article W; 114 a temperature controlling device having a heater for heating the article W; 7 a gas introducing means for a processing gas; and 8 an evacuation opening. The H-plane T junction 115 with a phase shifter makes the directions of electric field vectors E1, E2 at two introducing ports opposite to each other.

The generation of a plasma and the processing are carried out as follows.

First, the article W is put on the support 2 and is heated to a desired temperature using the temperature controlling device 114. The plasma processing chamber 9 is evacuated via an evacuation system (118, 128). Subsequently, a plasma processing gas is introduced at a predetermined flow rate into the plasma processing chamber 9 via the processing gas introducing port 7. Then, a conductance valve 128 provided in the evacuation system (118, 128) is adjusted to maintain the plasma processing chamber 9 at a predetermined pressure. Microwaves of a desired power from a microwave power source 6 are introduced into the circular waveguide 13 through the H-plane T junction 115 with a phase shifter. The microwaves are distributed into two at the H-plane T junction 115 with a phase shifter, then introduced into the circular waveguide 13 from the two introducing ports 25A, 25B, and further distributed by an E-plane junction to propagate in the right and the left directions within the waveguide 13. The microwaves distributed into two by the E-plane junction interfere with each other at the opposed portions of the respective introducing ports to strengthen the electric field crossing the slot 23 at every ½ of the guide wavelength and introduced into the plasma processing chamber 9 via the slots 23 through the dielectric 4. The electric field of the microwaves introduced into the plasma processing chamber 9 accelerates electrons to generate a plasma in the plasma processing chamber 9. At this time, the processing gas is excited by the generated high density plasma to process the surface of the article W put on the support 2.

The dielectric 4 is made of anhydrous synthetic quartz glass and has a disk-like shape with, e.g., a diameter 299 mm and a thickness 16 mm. The circular waveguide 13 has a 27 mm×96 mm inner wall cross section and a central diameter of 203 mm and is suitable for microwaves of $TE_{10}$ mode. As the material of the microwave applicator 3, Al is used entirely in order to suppress the propagation loss of microwaves. In an H-plane of the circular waveguide 13, are formed the slots 23 for supplying microwaves into the plasma processing chamber 9. Each slot 23 has a rectangular shape of 42 mm in length and 4 mm in width extending from the inner side surface to the outer side of the waveguide, and eight slots are formed in total radially at an interval of ½ of the guide wavelength at an interval of 45°. To the circular waveguide 13, are connected a microwave power source 6 of oscillation frequency 2.45 GHz provided with a 4E tuner, a directional coupler, an isolator, etc. in the mentioned order.

The microwave plasma processing apparatus shown in FIGS. 7A and 7B was used to generate a plasma under the conditions of an Ar flow rate of 500 sccm, pressures of 1.33 Pa and $1.33 \times 10^2$ Pa, and a microwave power of 3.0 kW, and the plasma obtained was measured. The plasma was measured as follows using a single probe method. The voltage applied to the probe was varied within a range of −50 V to +100 V, and a current flowing through the probe was measured by an I-V measuring device. The electron density, the electron temperature and the plasma potential were calculated from the thus obtained I-V curve by the Langmuir method. As a result, the electron density was $9 \times 10^{12}$/ $cm^3 \pm 2.7\%$ (within φ 300 plane) at 1.33 Pa and $8.7 \times 10^{11}$/ $cm^3 \pm 5.6\%$ (within φ 300 plane) at $1.33 \times 10^2$ Pa, and it was confirmed that a plasma having a high plasma density in the vicinity of the center was formed even in the high pressure region.

Plasma Processing Apparatus 3

Figure 8A:
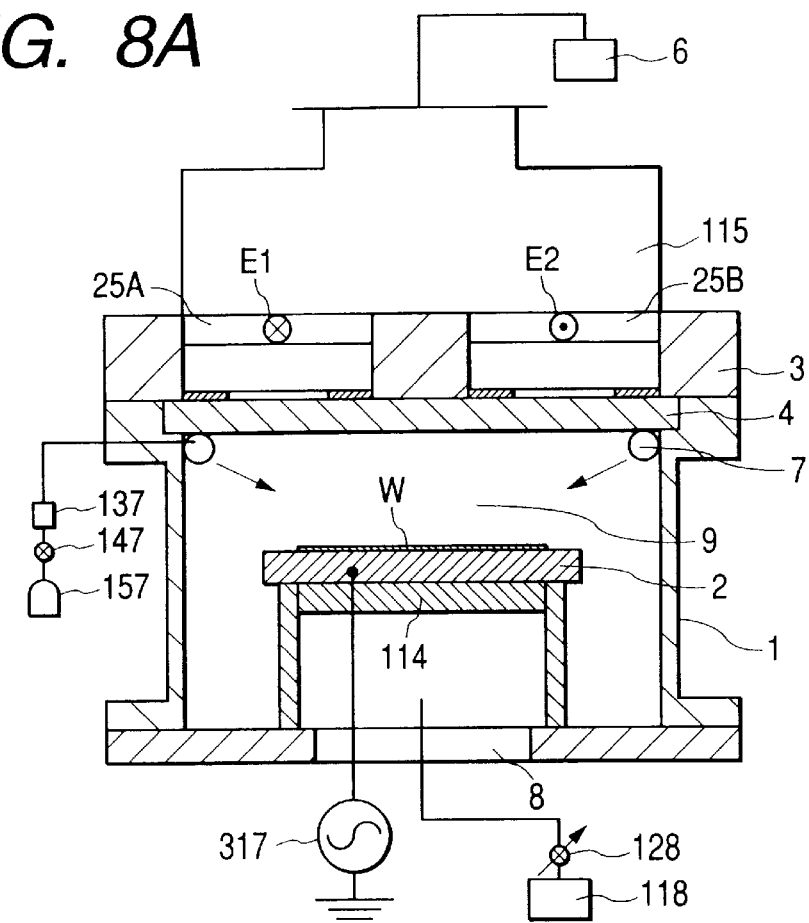
FIGS. 8A and 8B are schematic views showing a plasma processing apparatus in accordance with still another embodiment of the present invention.
Figure 8B:
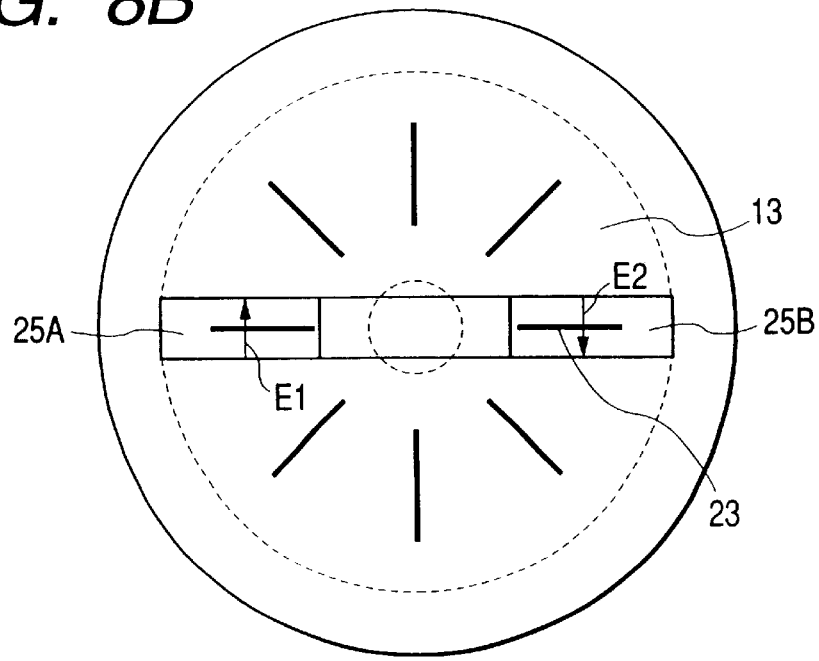

A microwave plasma processing apparatus in accordance with the present embodiment is shown in FIGS. 8A and 8B.

The apparatus is the same as the apparatus of FIGS. 7A and 7B except that a high frequency power source 317 is additionally provided so as to apply a bias voltage to the article W side to effect intentional incidence of positive ions.

As the temperature controlling device 114, a cooler may be used in the place of a heater.

Plasma Processing Apparatus 4

Figure 9A:
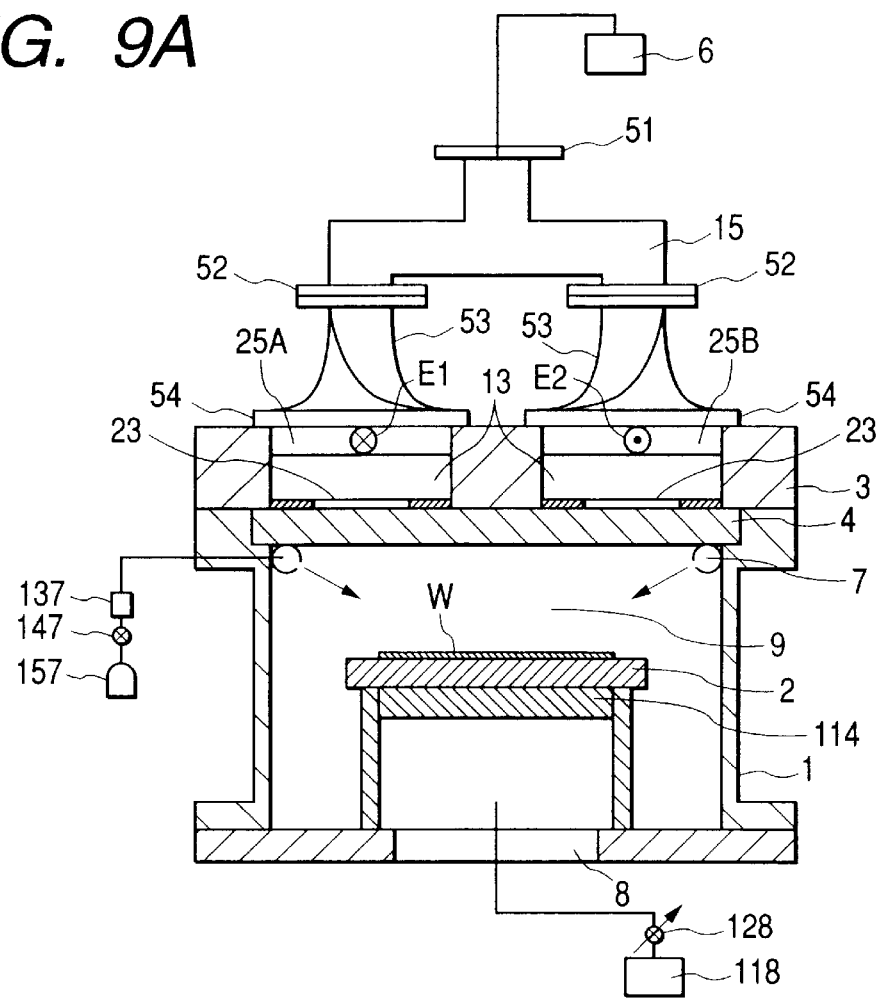
FIGS. 9A and 9B are schematic views showing a plasma processing apparatus in accordance with yet another embodiment of the present invention.
Figure 9B:
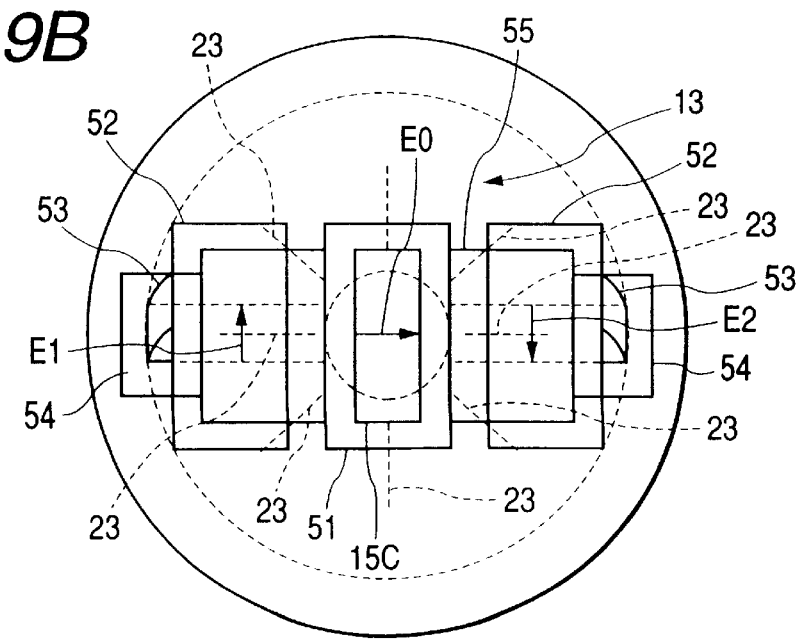

FIGS. 9A and 9B are schematic views showing a microwave plasma processing apparatus in accordance with the present embodiment, and FIG. 9A is a schematic sectional view of the whole apparatus and FIG. 9B is a schematic plan view of a microwave applicator.

In FIGS. 9A and 9B, reference numeral 1 designates a vessel constituting a plasma generation chamber 9; 2 a support means for supporting an article W; 114 a means for controlling the temperature of the article W; 7 a processing gas introducing means for introducing a processing gas; 8 an evacuation portion; 4 a dielectric window for separating the plasma generation chamber 9 from the atmosphere. Reference numeral 3 is a microwave applicator for supplying microwaves into the plasma generation chamber 9 and has a plurality of slots 23 provided by perforation at a predetermined interval in a surface (H-plane in the present embodiment) on the dielectric window 4 side and an endless circular waveguide 13 having two microwave introducing ports 25A, 25B provided at an interval of 180°. Reference numeral 15 is a junction means having an E-plane T junction for distribution into two in which the center axis of an introducing port 15C coincides with the center axis perpendicular to the H-plane of the circular waveguide; 53 are two twist waveguides having planes of polarization rotated by 90° in the right and the left directions, respectively.

Further, reference numeral 13 is a waveguide provided in the microwave applicator 3; EO is the electric field of microwaves introduced into the junction means 5; and E1 and E2 each show the electric field of microwaves at two introducing ports 25A, 25B.

The E-plane T junction of the junction means 15 and the twist waveguides 53 are connected to each other with flanges 52. Further, reference numerals 51, 54 designate mounting flanges.

Figure 10:
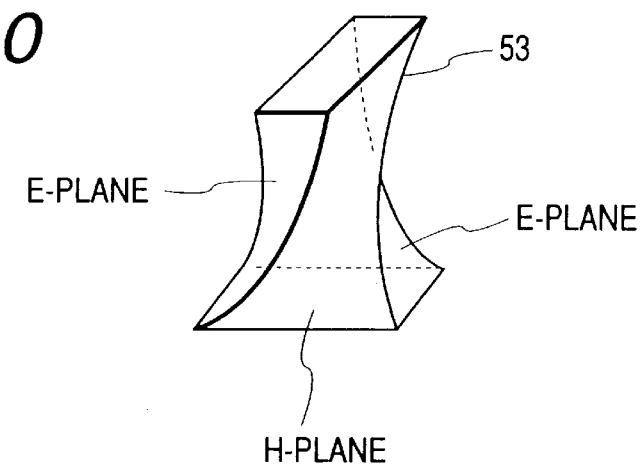
FIG. 10 is a schematic perspective view showing a twist waveguide used in the present invention.

FIG. 10 is a schematic perspective view of a twist waveguide, which is depicted with flange portions omitted for convenience sake. The figure shows a twist waveguide formed by twisting by 90° a rectangular waveguide for TE mode propagation of microwaves, from which it is understood that the E-planes and the H-planes are bent by 90° in the same direction.

The generation of a plasma and the processing using the microwave plasma processing apparatus are carried out as follows.

First, the plasma generation chamber 9 is evacuated via an evacuation system (118, 128). Subsequently, a processing gas is introduced at a predetermined flow rate into the plasma generation chamber 9 via the processing gas introducing port 7.

Then, a conductance valve 128 provided in the evacuation system (118, 128) is adjusted to maintain the plasma generation chamber 9 at a predetermined pressure. Microwaves of a desired power from a microwave power source 6 are supplied into the plasma generation chamber 9 via the E-plane T junction for distribution into two of the junction means 15, the twist waveguides 53 and further the circular waveguide 13 to generate a plasma in the plasma generation chamber 9.

At this time, the directions of the electric field vectors E1, E2 of the microwaves introduced from the two introducing ports 25A, 25B of the circular waveguide 13 are made opposite to each other by the twist waveguides 53, and the microwaves will strongly interfere with each other within the waveguide having a circumferential length which is an even multiple of the guide wavelength. At this time, the processing gas introduced into the plasma generation chamber 9 via the processing gas introducing port 7 is excited by the generated high density plasma to process the surface of the article W put on the support 2. This makes it possible to sufficiently secure the balance between the plasma density in the vicinity of one microwave introducing port 25B and that in the vicinity of its opposite portion 25A of the circular waveguide 13, so that processing can be effected uniformly in the circumferential direction.

Plasma Processing Apparatus 5

Figure 11:
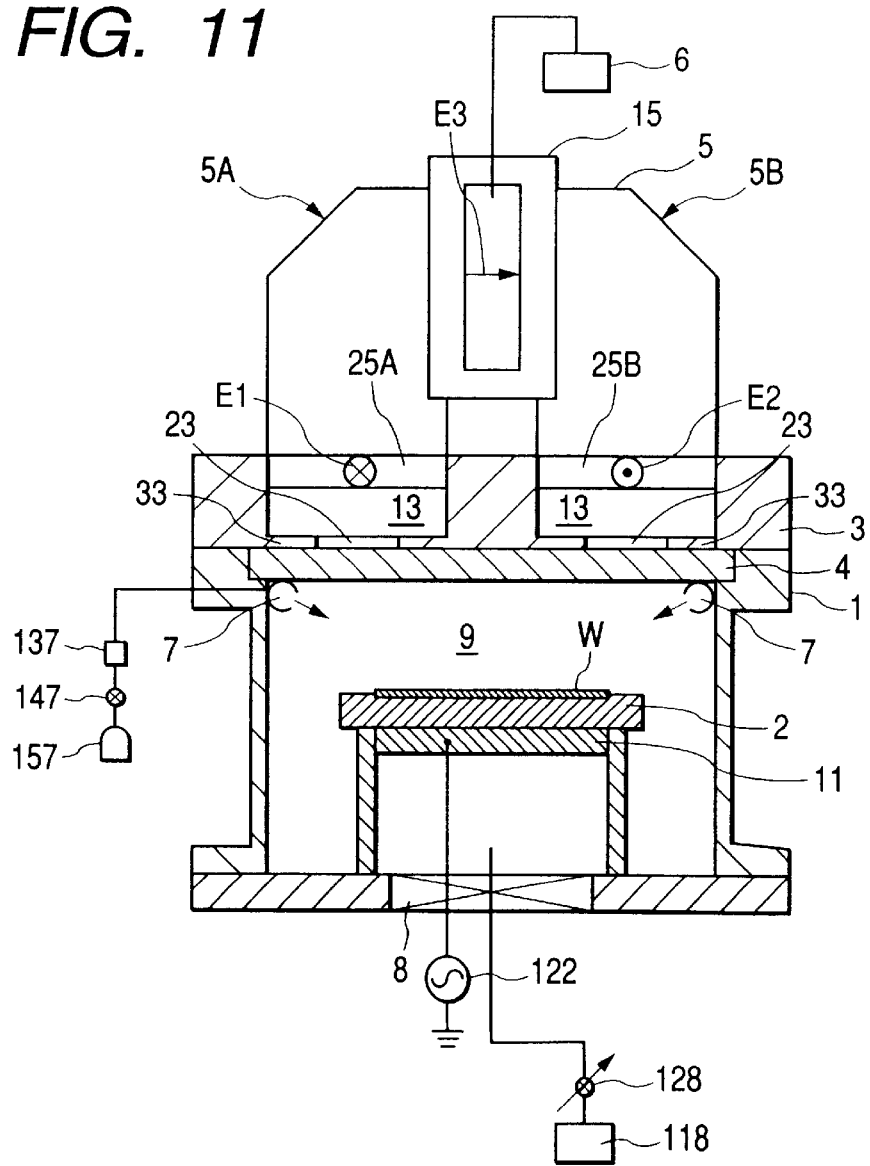
FIG. 11 is a schematic sectional view showing a plasma processing apparatus in accordance with still a further embodiment of the present invention.
Figure 12:
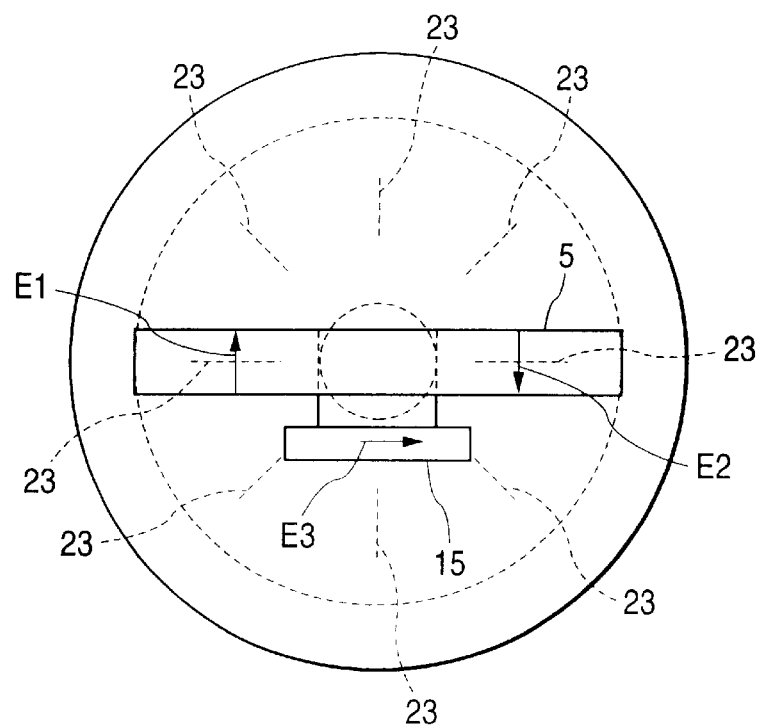
FIG. 12 is a schematic plan view of the plasma processing apparatus of FIG. 11.

FIG. 11 is a schematic sectional view of a plasma processing apparatus in accordance with the present embodiment and FIG. 12 is a schematic plan view of a microwave applicator used in the present invention.

The plasma processing apparatus is provided with a plasma generation chamber 9 formed in a vessel 1, a support means 2 for supporting an article W, a gas introducing means 7 for introducing a gas into the plasma generation chamber 9, an evacuation means 8 for evacuating the plasma generation chamber 9, and a microwave applicator 3 for supplying microwaves into the plasma generation chamber 9 through a dielectric window 4.

The microwave applicator 3 has a circular waveguide 13 having slots 23 in an H-plane 33, introducing ports 25A, 25B for introducing microwaves into the circular waveguide 13, and a junction circuit 15. The junction circuit 15 forms an E-plane T junction, the microwaves of $TE_{10}$ mode with an electric field vector E3 as introduced from a microwave power source 6 into the junction circuit 15 connected through a rectangular waveguide to the power source 6 are distributed into right and left rectangular waveguides 5, change the courses at E-corners 5A, 5B, and travel to introducing ports 25A and 25B.

At the introducing port 25A microwaves are introduced with an electric field vector E1, while at the introducing port 25B microwaves are introduced with an electric vector E2. The electric field vectors E1 and E2 are in directions opposite to each other as shown in FIGS. 11 and 12.

The microwaves introduced into the circular waveguide 13 from the introducing ports 25A, 25B each travel in both the clockwise and the counterclockwise directions within the waveguide 13. Since the circular waveguide 13 is endless, and since its circumferential length (length in the clockwise or counterclockwise direction) is an integral multiple of the guide wavelength (microwave propagation wavelength in waveguide), standing waves are generated. In the present embodiment, the circumferential length is set at an even multiple (e.g., 2 times, 4 times or 6 times) of the guide wavelength.

Next, the state of plasma generation will be described with reference to FIG. 13.

Figure 13:
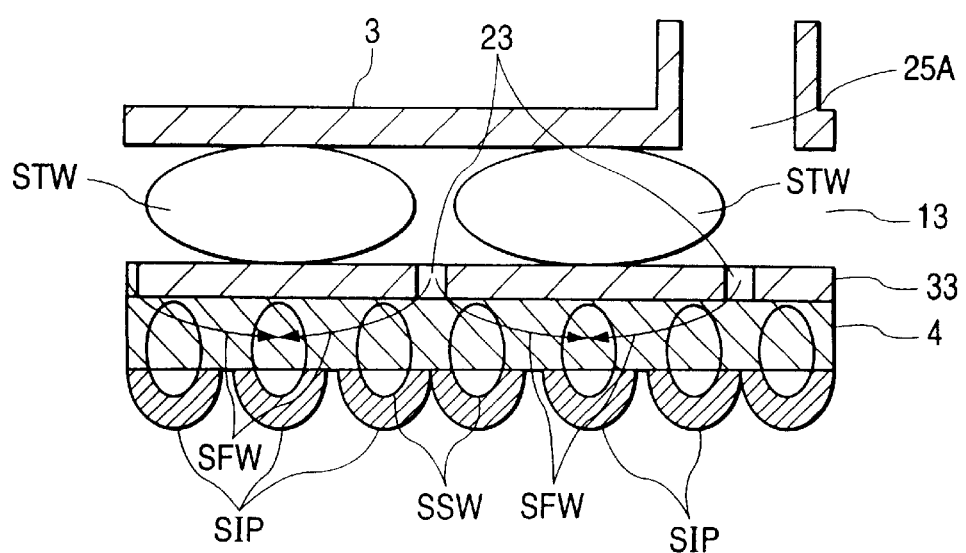
FIG. 13 is a schematic view for illustrating a state of plasma generation.

FIG. 13 is a schematic view showing microwaves and a plasma in the vicinity of the introducing port 25A.

In the waveguide 13, as described above, standing waves STW are generated by interference of microwaves. The microwaves leak out through the slots 23 and propagate along the surface of the electric window 4 to generate surface waves SFW. Surface waves SFW emitted from two adjoining slots interfere with each other to generate surface standing waves SSW. The surface standing waves SSW generate surface-wave interfered plasma SIP.

Since the two introducing ports are provided at locations different by 180° of the waveguide 13, and since the circumferential length of the waveguide is set at an even multiple of the guide wavelength and microwaves are introduced into the waveguide 13 such that the electric field vectors E1 and E2 are in directions opposite to each other, the balance of plasma density is not lost, so that a high density, low potential plasma can be generated uniformly along the surface of the dielectric window 4.

Reference numeral 11 designates a temperature controlling device such as a cooler or heater, which is allowed to operate as needed.

Further, it is preferred that a bias voltage source 122 such as a high frequency power source or DC power source is additionally provided for the support means 2 to apply a bias voltage to the article W thereby controlling the incidence of charged particles as the occasion demands.

The slots 23 are provided at an interval of ½ of the guide wavelength. When the circumferential length of the circular waveguide is designed so as to be 4 times the guide wavelength, provision of eight slots 23 in total at every 45° will suffice.

When the circumferential length is designed so as to be twice the guide wavelength, provision of four slots in total at every 90° will suffice.

The generation of a plasma and the processing using the microwave plasma processing apparatus are carried out as follows.

First, the plasma generation chamber 9 is evacuated via an evacuation opening of the evacuation means 8. Subsequently, a plasma processing gas is introduced at a predetermined flow rate into the plasma generation chamber 9 via the gas introducing means 7. Then, a conductance valve 128 provided in the evacuation means 8 is adjusted to maintain the plasma generation chamber 9 at a predetermined pressure. Microwaves of a desired power from a microwave power source 6 are supplied into the plasma generation chamber 9 via the E-plane T junction 15, the introducing ports 25A, 25B, the waveguide 13 and the microwave applicator 3 with the slots 23, which generates a plasma in the plasma generation chamber 9. At this time, the directions of the electric field vectors of the microwaves introduced from the two introducing ports 25A, 25B of the circular waveguide 13 are made opposite to each other by the E-plane junction of the junction circuit 15, and the microwaves will strongly interfere with each other within the waveguide 13 having a circumferential length which is an even multiple of the guide wavelength. At this time, the processing gas introduced into the plasma generation chamber 9 via the processing gas introducing means 7 is excited by the generated high density plasma to form radicals or ions, thus processing the surface of the article W put on the support 2.

Plasma Processing Apparatus 6

Figure 14:
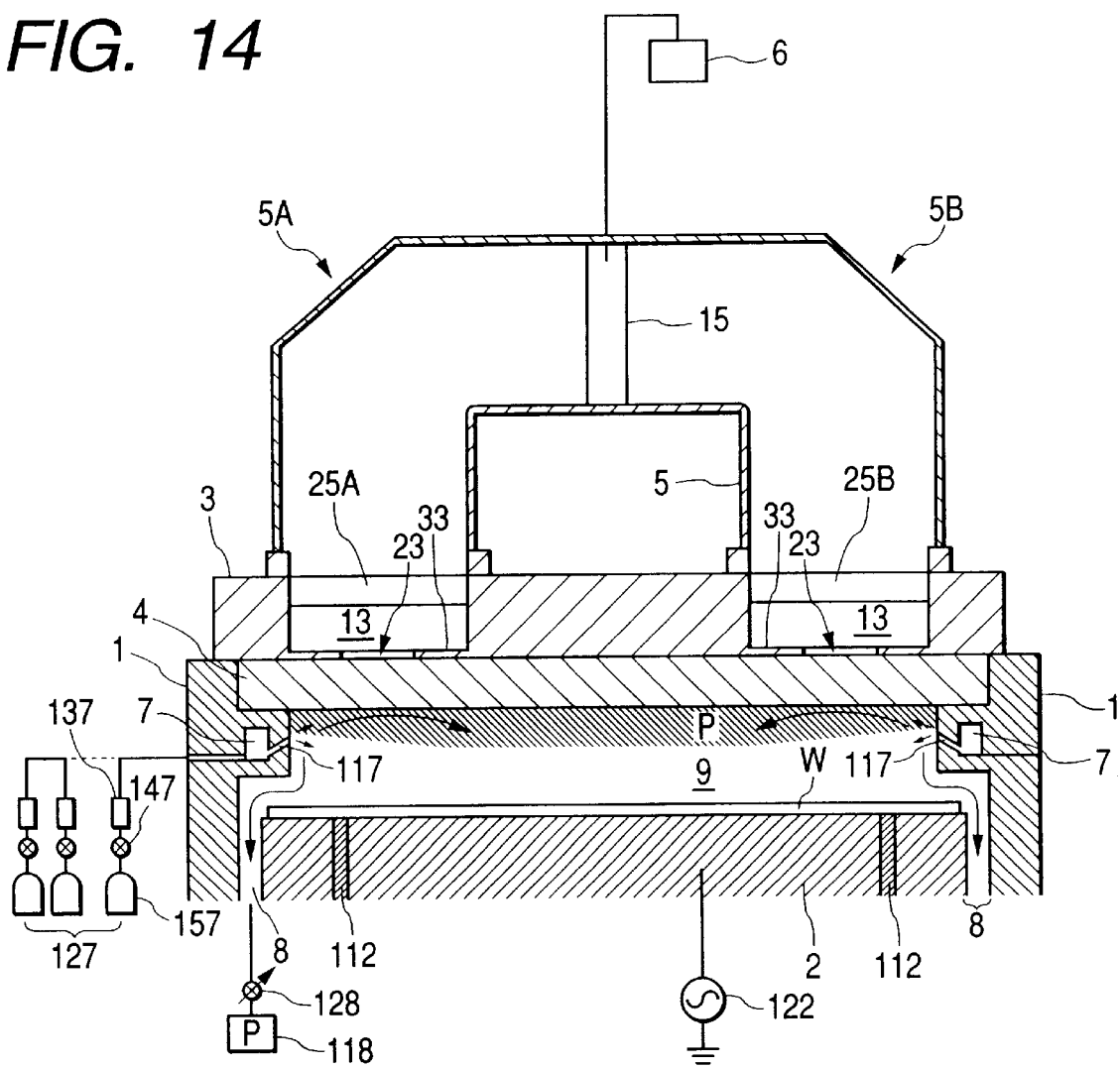
FIG. 14 is a schematic sectional view showing a plasma processing apparatus in accordance with yet another embodiment of the present invention.

FIG. 14 is a schematic sectional view of a plasma processing apparatus in accordance with the present embodiment, in which the same reference numerals as used in FIG. 11 denote the same members as those in the apparatus of FIG. 11.

Figure 15:
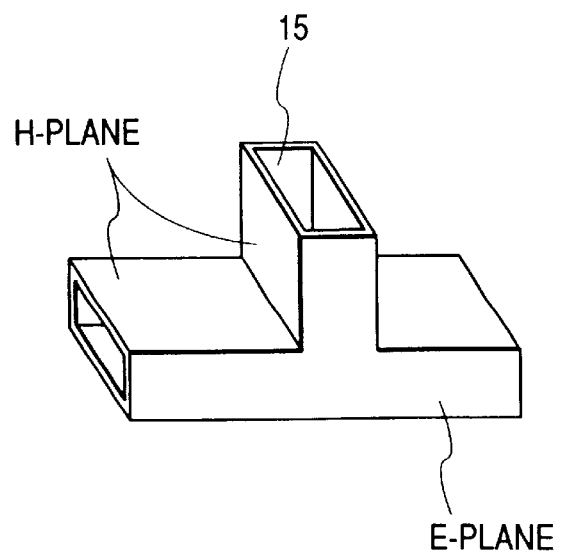
FIG. 15 is a schematic perspective view showing a junction circuit used in the present invention.

FIG. 15 is a schematic perspective view of a major part of the junction circuit 15 used into the apparatus shown in FIG. 14.

The basic structure of the apparatus of FIG. 14 is the same as that of FIG. 11 except for detail structure.

In FIG. 14, reference numeral 117 designate a gas emission port for emitting a gas to the dielectric window. A gas source 127 is provided which contains gas cylinders 157, valves 147, mass flow controllers 137, and so on.

The evacuation system contains a vacuum pump 118, a conductance controlling valve 128, and so on.

The support means 2 has lift pins 112 that can elevate and lower the article W so as to be either in contact with or not in contact with the upper surface of the support means 2.

Microwaves oscillated by the microwave power source 6 connected to the inlet of the junction circuit 15 are distributed by the junction circuit 15 forming E-plane T junction in $TE_{10}$ mode into the right and the left symmetric rectangular waveguides 5, change the courses at right angles at E-corners 5A, 5B, and travel to the introducing ports 25A and 25B. Since the introducing ports each form E-plane T junctions, the microwaves are further distributed in the circular waveguide 13.

Standing waves are generated in the circular waveguide 13, microwaves are emitted through the slots 23 to generate a plasma P in the plasma generation chamber 9 as described above. The state of microwave propagation and plasma generation in accordance with the present invention is as described above with reference to FIG. 13.

The present invention can be applied to plasma processing in at least one of resist removing step, etching step, film forming step, doping step, and cleaning step in production of semiconductor devices such as MOS transistors.

A specific example thereof is described below.

FIGS. 16A to 16E are schematic sectional views illustrating a production method of a semiconductor device according to the present invention.

Figure 16A:
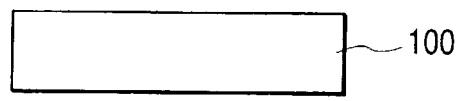
FIGS. 16A, 16B, 16C, 16D, and 16E are schematic views showing a process of producing a semiconductor device according to the present invention.

First, as shown in FIG. 16A, a substrate 100 such as a silicon wafer is provided.

Figure 16B:
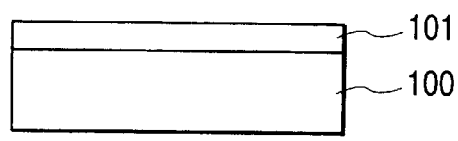

Next, as shown in FIG. 16B, an insulating film 101 is formed on the substrate 100 by the microwave plasma CVD process of the present invention or other CVD processes or application methods.

Figure 16C:
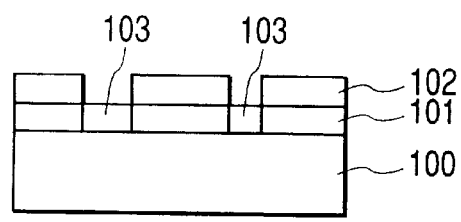

Then, as shown in FIG. 16C, a photoresist pattern 102 is formed on the insulating film 101, and holes 103 are formed in the insulating film 101 by the microwave plasma etching process of the present invention or other etching processes.

Figure 16D:
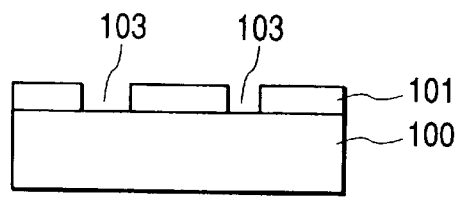

Subsequently, as shown in FIG. 16D, the photoresist pattern 102 is removed by the microwave plasma ashing process of the present invention or other resist stripping processes.

Then, the bottom surfaces of the holes 103 of the insulating film 101 is cleaned by the microwave plasma cleaning process of the present invention or other cleaning processes.

Figure 16E:
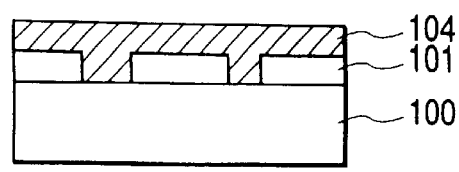
Figure 17:
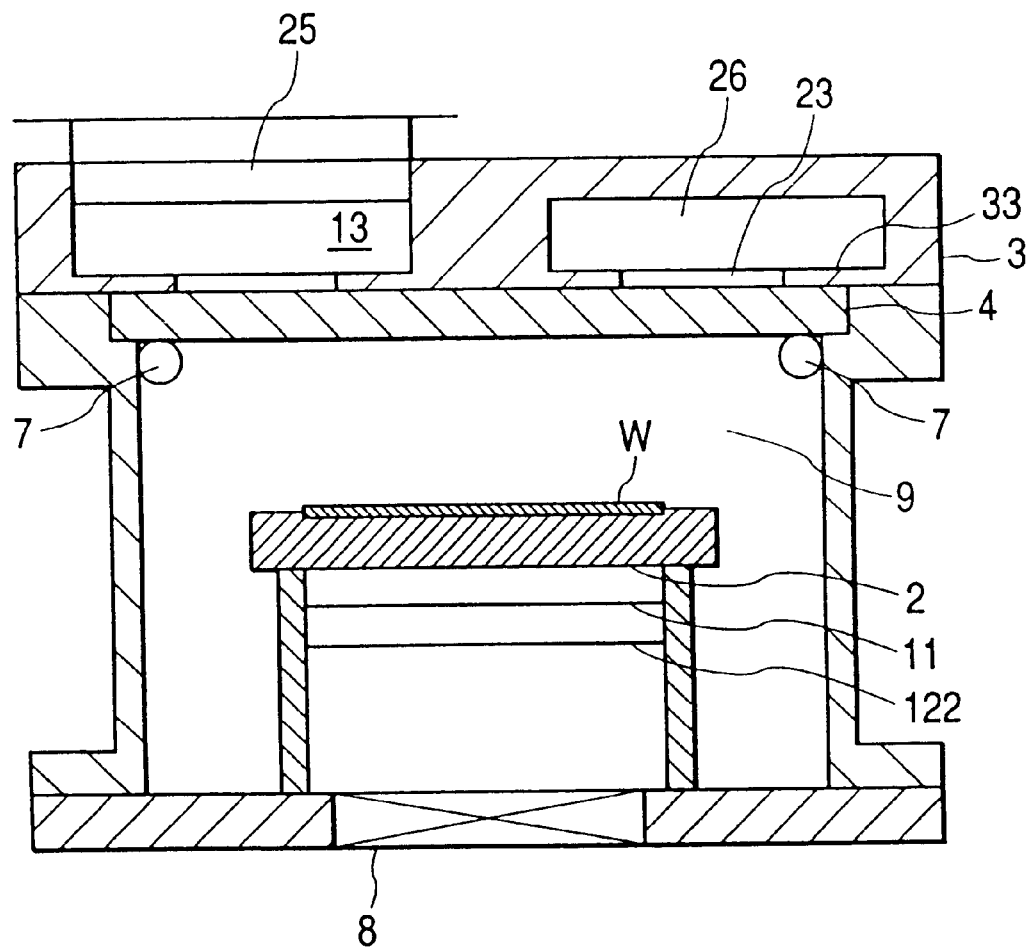
FIG. 17 is a schematic sectional view showing a plasma processing apparatus of the prior art.

Finally, as shown in FIG. 16E, a metal such as copper, tungsten, etc. is deposited thereon to form a conductive layer 104 in the holes 103 and on the insulating film 101.

Thus, a semiconductor device having holes and an electric wire formed thereon is obtained.

The present invention is specifically described below with reference to examples, but the present invention is not limited to these examples.

EXAMPLE 1

The microwave plasma processing apparatus shown in FIGS. 6A and 6B was used to carry out ashing of a photoresist by the following procedure.

As the article W, was used a silicon substrate φ 8 inches) immediately after an interlayer $SiO_2$ film was etched to form via holes. First, the Si substrate was put on the substrate holding means 2, and the plasma generation chamber 9 was evacuated via the evacuation system (118, 128) to reduce the pressure down to $1.33\times10^{-3}$ Pa. Oxygen gas was introduced at a flow rate of 2 slm into the plasma generation chamber 9 via the plasma processing gas introducing port 7. Then, the conductance valve 128 provided in the evacuation system (118, 128) was adjusted to maintain the inside of the plasma generation chamber 9 at $1.33\times10^2$ Pa. A power of 1.5 kW from the microwave power source 6 of 2.45 GHz was supplied into the plasma generation chamber 9 through the microwave applicator 3 to generate a plasma in the plasma generation chamber 9. At this time, the oxygen gas introduced via the plasma processing gas introducing port 7 was excited, decomposed and reacted to be converted to ozone in the plasma generation chamber 9, which was then transported toward the Si substrate W to oxidize the photoresist on the substrate, thus vaporizing the photoresist to be removed. After ashing, the ashing speed and the charge density on the surface of the substrate were evaluated.

The ashing speed and uniformity obtained was as very good as 6.6 μm/min±4.5%, and the surface charge density was as sufficiently low as $-1.3\times10^{11}/cm^2$.

EXAMPLE 2

The microwave plasma processing apparatus shown in FIGS. 7A and 7B was used to carry out ashing of a photoresist.

As the article W, was used a silicon substrate φ 8 inches) immediately after an interlayer $SiO_2$ film was etched to form via holes. First, the Si substrate was put on the substrate holding means 2, and the plasma generation chamber 9 was evacuated via the evacuation system (118, 128) to reduce the pressure down to $1.33\times10^{-3}$ Pa. Oxygen gas was introduced at a flow rate of 2 slm into the plasma generation chamber 9 via the plasma processing gas introducing port 7. Then, the conductance valve 128 provided in the evacuation system (118, 128) was adjusted to maintain the inside of the plasma generation chamber 9 at $1.33\times10^2$ Pa. A power of 1.5 kW from the microwave power source 6 of 2.45 GHz was supplied into the plasma generation chamber 9 through the microwave applicator 3 to generate a plasma in the plasma generation chamber 9. At this time, the oxygen gas introduced via the plasma processing gas introducing port 7 was excited, decomposed and reacted to be converted to ozone in the plasma generation chamber 9, which was then transported toward the Si substrate W to oxidize the photoresist on the substrate, thus vaporizing the photoresist to be removed. After ashing, the ashing speed and the charge density on the surface of the substrate were evaluated.

The ashing speed and uniformity obtained was large as 6.4 μm/min±3.4%, and the surface charge density was as sufficiently low as $-1.4\times10^{11}/cm^2$.

EXAMPLE 3

The microwave plasma processing apparatus shown in FIGS. 6A and 6B was used to form a silicon nitride film serving to protect a semiconductor element by the following procedure.

The article W provided was a P-type single crystal silicon substrate (face orientation <100>; resistivity: 10 Ωcm) with an interlayer $SiO_2$ film on which an Al wiring pattern with line and space each of 0.5 μm was formed. First, the silicon substrate was put on the substrate holding means 2, and the plasma generation chamber 9 was then evacuated via the evacuation system (118, 128) to reduce the pressure down to $1.33\times10^{-5}$ Pa. Subsequently, the temperature controlling device 114 was energized to heat the silicon substrate to 300° C., and the substrate was maintained at this temperature. Nitrogen gas at a flow rate of 600 sccm and monosilane gas at a flow rate of 200 sccm were introduced into the plasma generation chamber 9 via the plasma processing gas introducing port 7. Then, the conductance valve 128 provided in the evacuation system (118, 128) was adjusted to maintain the inside of the plasma generation chamber 9 at 2.67 Pa. Subsequently, a power of 3.0 kW from the microwave power source 6 of 2.45 GHz was introduced via the microwave applicator 3. Thus, a plasma was generated in the chamber 9. At this time, the nitrogen gas introduced via the plasma processing gas introducing port 7 was excited and decomposed in the plasma generation chamber 9 to form an active species, which was then transported toward the silicon substrate to react with the monosilane gas, thereby forming a 1.0 µm thick silicon nitride film on the silicon substrate.

After the film formation, the film formation speed and the film quality such as stress were evaluated. For the stress, the change in the amount of the warpage of the substrate was measured before and after the film formation using a laser interferometer Zygo (trade name).

The formation speed and uniformity of the silicon nitride film obtained was as very large as 510 nm/min±2.5%, and for the film quality, the stress was $1.2 \times 10^9$ dyne/cm$^2$ (compression), the leak current was $1.2 \times 10^{-10}$ A/cm$^2$, and the dielectric strength was 9 MV/cm, and the film was therefore confirmed to have very good quality.

EXAMPLE 4

The microwave plasma processing apparatus shown in FIGS. 7A and 7B was used to form a silicon oxide film and a silicon nitride film serving as an anti-reflection film for a plastic lens by the following procedure.

The article W provided was a plastic convex lens of a diameter 50 mm. First, the lens was put on the substrate holding base 2, and the inside of the plasma generation chamber 9 was evacuated via the evacuation system (118, 128) to reduce the pressure down to $1.33 \times 10^{-5}$ Pa. Nitrogen gas at a flow rate of 160 sccm and monosilane gas at a flow rate of 100 sccm were introduced into the plasma generation chamber 9 via the plasma processing gas introducing port 7. Then, the conductance valve 128 provided in the evacuation system (118, 128) was adjusted to maintain the inside of the plasma generation chamber 9 at $9.33 \times 10^{-1}$ Pa. Subsequently, a power of 3.0 kW from the microwave power source 6 of 2.45 GHz was supplied into the plasma generation chamber 9 through the microwave applicator 3 to generate a plasma in the plasma generation chamber 9. At this time, the nitrogen gas introduced via the plasma processing gas introducing port 7 was excited and decomposed in the plasma generation chamber 9 to form an active species such as nitrogen atoms, which was then transported toward the lens to react with the monosilane gas, thereby forming a silicon nitride film in a 21 nm thickness on the surface of the lens.

Next, oxygen gas at a flow rate of 200 sccm and monosilane gas at a flow rate of 100 sccm were introduced into the plasma generation chamber 9 via the plasma processing gas introducing port 7. Then, the conductance valve 128 provided in the evacuation system (118, 128) was adjusted to maintain the inside of the plasma generation chamber 9 at 13.3 Pa. Subsequently, a power of 2.0 kW from the microwave power source 6 of 2.45 GHz was supplied into the plasma generation chamber 9 through the microwave applicator 3 to generate a plasma in the plasma generation chamber 9. At this time, the oxygen gas introduced via the plasma processing gas introducing port 7 was excited and decomposed in the plasma generation chamber 9 to form an active species such as oxygen atoms, which was then transported toward the lens to react with the monosilane gas, thereby forming a silicon oxide film in a 86 nm thickness on the lens. After the film formation, the film formation speed and the reflection characteristic were evaluated.

The formation speeds and uniformities of the silicon nitride and silicon oxide films as obtained were as good as 320 nm/min±2.2% and 350 nm/min±2.6%, respectively, and the reflectance in the vicinity of 500 nm was 0.3%, and the film was thus confirmed to have very excellent optical characteristics.

EXAMPLE 5

The microwave plasma processing apparatus shown in FIGS. 8A and 8B was used to form a silicon oxide film for interlayer insulation of a semiconductor element by the following procedure.

The article W provided was a P-type single crystal silicon substrate (face orientation <100>; resistivity: 10 Ωcm) having formed on the top portion an Al pattern of line and space of 0.5 µm each. First, the silicon substrate was put on the substrate support 2. The plasma generation chamber 9 was then evacuated via the evacuation system (118, 128) to reduce the pressure down to $1.33 \times 10^{-5}$ Pa. Subsequently, the temperature controlling device 114 was energized to heat the silicon substrate to 300° C., and the substrate was maintained at this temperature. Oxygen gas at a flow rate of 500 sccm and monosilane gas at a flow rate of 200 sccm were introduced into the plasma generation chamber 9 via the plasma processing gas introducing port 7. Then, the conductance valve 128 provided in the evacuation system (118, 128) was adjusted to maintain the inside of the plasma generation chamber 9 at 4.00 Pa. Subsequently, a power of 300 W was applied to the substrate support 2 with the high frequency application means 317 of 13.56 MHz, while a power of 2.0 kW from the microwave power source 6 of 2.45 GHz was supplied into the plasma generation chamber 9 through the microwave applicator 3, thus generating a plasma in the plasma generation chamber 9. The oxygen gas introduced via the plasma processing gas introducing port 7 was excited and decomposed in the plasma generation chamber 9 to form an active species, which was then transported toward the silicon substrate to react with the monosilane gas, thereby forming a silicon oxide film in a 0.8 µm thickness on the silicon substrate. At this time, ion species were accelerated by the RF bias to be incident to the substrate and to polish the film surface on the pattern, thereby improving the flatness.

After the processing, the film formation speed, uniformity, dielectric strength, and step coverage were evaluated. The step coverage was evaluated by observing a cross section of the silicon oxide film formed on the Al pattern with a scanning electron microscope (SEM) to check presence of voids.

The formation speed and uniformity of the silicon oxide film thus obtained was as good as 240 nm/min±2.5%, and the dielectric strength was 8.5 MV/cm and no voids were found. Therefore, the film was confirmed to have excellent quality.

EXAMPLE 6

The microwave plasma processing apparatus shown in FIGS. 8A and 8B was used to etch an interlayer $SiO_2$ film of a semiconductor element by the following procedure.

The article W provided was a P-type single crystal silicon substrate (face orientation <100>; resistivity: 10 Ωcm) having formed on an Al pattern of line and space of 0.18 μm an interlayer SiO$_2$ film in 1 μm thickness. First, after the silicon substrate was put on the substrate support 2, the plasma generation chamber 9 was evacuated via the evacuation system (118, 128) to reduce the pressure down to 1.33×10$^{-5}$ Pa. C$_4$F$_8$ gas at a flow rate of 100 sccm was introduced into the plasma generation chamber 9 via the plasma processing gas introducing port 7. Then, the conductance valve 128 provided in the evacuation system (118, 128) was adjusted to maintain the inside of the plasma generation chamber 9 at 1.33 Pa. Subsequently, a power of 300 W was applied to the substrate support 2 with the high frequency application means 317 of 13.56 MHz, while a power of 2.0 kW from the microwave power source 6 of 2.45 GHz was supplied into the plasma generation chamber 9 through the microwave applicator 3, thus generating a plasma in the plasma generation chamber 9. The C$_4$F$_8$ gas introduced via the plasma processing gas introducing port 7 was excited and decomposed in the plasma generation chamber 9 to form an active species, which was then transported toward the silicon substrate, where ions accelerated by a self bias etched the interlayer SiO$_2$ film. The temperature controlling device 114 prevented the temperature of the substrate from increasing above 80° C.

After the etching, the etch rate, etch selectivity, and etched shape were evaluated. The etched shape was evaluated by using a scanning electron microscope (SEM) to observe a cross section of the etched silicon oxide film.

The etch rate and uniformity and the etch selectivity to polysilicon were as good as 540 nm/min±2.2% and 20, respectively, and it was confirmed that the etched shape was almost vertical, and that the microloading effect was small.

EXAMPLE 7

The microwave plasma processing apparatus shown in FIGS. 9A and 9B was used to carry out ashing of a photoresist by the following procedure.

As the article W, was used a silicon substrate ϕ 8 inches) immediately after an interlayer SiO$_2$ film was etched to form via holes.

First, the Si substrate was put on the substrate support 2, and the plasma generation chamber.9 was evacuated via the evacuation system (118, 128) to reduce the pressure down to about 1.3×10$^{-3}$Pa. Oxygen gas as the plasma processing gas was introduced at a flow rate of 2 slm into the plasma generation chamber 9 through the plasma processing gas introducing port 7.

Then, the conductance valve 128 provided in the evacuation system (118, 128) was adjusted to maintain the inside of the plasma generation chamber 9 at 133 Pa. A power of 1.5 kW from the microwave power source 6 of 2.45 GHz was supplied into the plasma generation chamber 9 through the microwave applicator 3.

Thus, a plasma was generated in the plasma generation chamber 9. At this time, the oxygen gas as introduced through the plasma processing gas introducing port 7 was excited, decomposed and reacted to be converted to ozone in the plasma generation chamber 9, which was then transported toward the silicon substrate to oxidize the photoresist on the substrate, whereby the photoresist was vaporized to be removed.

After the ashing, the ashing speed and the charge density on the surface of the substrate were evaluated, with the result that the ashing speed and its uniformity obtained was as significantly good as 6.6 μm/min±4.5%, and the surface charge density was as sufficiently low as −1.3×10$^{11}$/cm$^2$.

When ashing of a photoresist was carried out again following the procedure as described above, the ashing speed and its uniformity obtained was as significantly large as 6.4 μm/min±3.4%, and the surface charge density was as sufficiently low as −1.4×10$^{11}$/cm$^2$.

EXAMPLE 8

The microwave plasma processing apparatus shown in FIGS. 9A and 9B was used to form a silicon nitride film serving to protect a semiconductor element by the following procedure.

The article W provided was a P-type single crystal silicon substrate (face orientation <100>; resistivity: 10 Ωcm) with an interlayer SiO$_2$ film on which an Al wiring pattern (line and space: 0.5 μm) was formed.

First, after the silicon substrate was put on the substrate support 2, the plasma generation chamber 9 was then evacuated via the evacuation system (118, 128) to reduce the pressure down to about 1.3×10$^{-5}$ Pa. Subsequently, the temperature controlling device 114 was energized to heat the silicon substrate to 300° C., and the substrate was maintained at this temperature. Nitrogen gas at a flow rate of 600 sccm and monosilane gas at a flow rate of 200 sccm were introduced through the plasma processing gas introducing port 7 into the plasma generation chamber 9.

Then, the conductance valve 128 provided in the evacuation system (118, 128) was adjusted to maintain the inside of the plasma generation chamber 9 at 2.67 Pa. Subsequently, a power of 3.0 kW from the microwave power source 6 of 2.45 GHz was supplied into the plasma generation chamber 9 through the microwave applicator 3.

Thus, a plasma was generated in the plasma generation chamber 9. At this time, the nitrogen gas introduced via the plasma processing gas introducing port 7 was excited and decomposed in the plasma generation chamber 9 to form an active species, which was then transported toward the silicon substrate to react with the monosilane gas, thereby depositing a silicon nitride film in 1.0 μm thickness on the silicon substrate. After the film formation, the film formation speed and the film quality such as stress were evaluated. For the stress, the change in the amount of the warpage of the substrate was measured before and after the film formation using a laser interferometer Zygo (trade name).

The formation speed and its uniformity of the silicon nitride film obtained was as significantly large as 510 nm/min±2.5%, and for the film quality, the stress was 1.2×10$^9$ dyne/cm$^2$ (compression), the leak current was 1.2× 10$^{-10}$ A/cm$^2$, and the dielectric strength was 9 MV/cm, and the film was therefore confirmed to be very excellent.

EXAMPLE 9

The microwave plasma processing apparatus shown in FIGS. 9A and 9B was used to form a silicon oxide film and a silicon nitride film serving as an anti-reflection film for a plastic lens by the following procedure.

The article W provided was a plastic convex lens of a diameter 50 mm. After the lens was put on the substrate support 2, the plasma generation chamber 9 was evacuated via the evacuation system (118, 128) to reduce the pressure down to about 1.3×10$^{-5}$ Pa.

First, nitrogen gas at a flow rate of 160 sccm and monosilane gas at a flow rate of 100 sccm were introduced through the plasma processing gas introducing port 7 into the plasma generation chamber 9.

Then, the conductance valve 128 provided in the evacuation system (118, 128) was adjusted to maintain the inside of the plasma generation chamber 9 at 0.93 Pa. Subsequently, a power of 3.0 kW from the microwave power source 6 of 2.45 GHz was supplied into the plasma generation chamber 9 through the microwave applicator 3. Thus, a plasma was generated in the plasma generation chamber 9. At this time, the nitrogen gas introduced via the plasma processing gas introducing port 7 was excited and decomposed in the plasma generation chamber 9 to form an active species such as nitrogen atoms, which was then transported toward the lens to react with the monosilane gas, thereby forming a silicon nitride film in a 21 nm thickness on the surface of the lens.

Next, oxygen gas at a flow rate of 200 sccm and monosilane gas at a flow rate of 100 sccm were introduced into the plasma generation chamber 9 via the plasma processing gas introducing port 7.

Then, the conductance valve 128 provided in the evacuation system (118, 128) was adjusted to maintain the inside of the plasma generation chamber 9 at 0.13 Pa. Subsequently, a power of 2.0 kW from the microwave power source 6 of 2.45 GHz was supplied into the plasma generation chamber 9 through the microwave applicator 3.

Thus, a plasma was generated in the plasma generation chamber 9. At this time, the oxygen gas introduced through the plasma processing gas introducing port 7 was excited and decomposed in the plasma generation chamber 9 to form active species such as oxygen atoms, which was then transported toward the lens to react with the monosilane gas, thereby depositing a silicon oxide film in a 86 nm thickness on the lens.

The formation speeds and uniformities of the silicon nitride and silicon oxide films as obtained were as good as 320 nm/min±2.2% and 350 nm/min±2.6%, respectively, and for the film quality, the reflectance in the vicinity of 500 nm was 0.3%, with the result that the film was thus confirmed to have very good optical characteristics.

EXAMPLE 10

The microwave plasma processing apparatus shown in FIGS. 9A and 9B was used to form a silicon oxide film for interlayer insulation of a semiconductor element by the following procedure.

The article W provided was a P-type single crystal silicon substrate (face orientation <100>; resistivity: 10 Ωcm) having formed on the top portion an Al pattern (line and space: 0.5 μm).

First, the silicon substrate was put on the substrate support 2. The plasma generation chamber 9 was then evacuated via the evacuation system (118, 128) to reduce the pressure down to $1.3 \times 10^{-5}$ Pa. Subsequently, the temperature controlling device 114 was energized to heat the silicon substrate to 300° C., and the substrate was maintained at this temperature. Oxygen gas at a flow rate of 500 sccm and monosilane gas at a flow rate of 200 sccm were introduced through the plasma processing gas introducing port 7 into the plasma generation chamber 9.

Then, the conductance valve 128 provided in the evacuation system (118, 128) was adjusted to maintain the inside of the plasma generation chamber 9 at 4.0 Pa. Subsequently, a power of 300 W from a high frequency application means of 13.56 MHz provided similarly to 317 of FIG. 8 to was applied to the substrate support 2, while a power of 2.0 kW from the microwave power source 6 of 2.45 GHz was supplied into the plasma generation chamber 9 through the microwave applicator 3.

Thus, a plasma was generated in the plasma generation chamber 9. The oxygen gas as introduced through the plasma processing gas introducing port 7 was excited and decomposed in the plasma generation chamber 9 to form an active species, which was then transported toward the silicon substrate to react with the monosilane gas, thereby forming a silicon oxide film in the thickness of 0.8 μm on the silicon substrate. At this time, the ion species has a function of being accelerated by the RF bias to be incident upon the substrate and to cut the film on the pattern, thereby improving the flatness of the film. After the processing, the film formation speed, uniformity, dielectric strength, and step coverage were evaluated. The step coverage was evaluated by observing a cross section of the silicon oxide film formed on the Al pattern with a scanning electron microscope (SEM) to check presence of voids.

The formation speed and uniformity of the silicon oxide film thus obtained was as good as 240 nm/min±2.5%, and the dielectric strength was 8.5 MV/cm and no voids were found. Therefore, the film was confirmed to be excellent.

EXAMPLE 11

The microwave plasma processing apparatus shown in FIGS. 9A and 9B was used to etch an interlayer $SiO_2$ film of a semiconductor element by the following procedure.

The article W provided was a P-type single crystal silicon substrate (face orientation <100>; resistivity: 10 Ωcm) having formed on an Al pattern (line and space: 0.18 μm) an interlayer $SiO_2$ film in 1 μm thickness.

First, after the silicon substrate was put on the substrate support 2, the plasma generation chamber 9 was evacuated via the evacuation system (118, 128) to reduce the pressure down to $1.3 \times 10^{-5}$ Pa. $C_4F_8$ gas at a flow rate of 100 sccm was introduced through the plasma processing gas introducing port 7 into the plasma generation chamber 9.

Then, the conductance valve 128 provided in the evacuation system (118, 128) was adjusted to maintain the inside of the plasma generation chamber 9 at 1.33 Pa. Subsequently, a power of 300 W from a high frequency application means of 13.56 MHz provided similarly to 317 of FIG. 8A was applied to the substrate support 2, while a microwave power of 2.0 kW from the microwave power source 6 of 2.45 GHz was supplied into the plasma generation chamber 9 through the microwave applicator 3.

Thus, a plasma was generated in the plasma generation chamber 9. The $C_4F_8$ gas as introduced through the plasma processing gas introducing port 7 was excited and decomposed in the plasma generation chamber 9 to form an active species, which was then transported toward the silicon substrate, where ions accelerated by a self bias etched the interlayer $SiO_2$ film. The cooler 414 prevented the temperature of the substrate from increasing above 80° C. After the etching, the etch rate, etch selectivity, and etched shape were evaluated. The etched shape was evaluated by using a scanning electron microscope (SEM) to observe a cross section of the etched silicon oxide film.

The etch rate, its uniformity and the etch selectivity to polysilicon were as good as 540 nm/min±2.2% and 20, respectively, and it was confirmed that the etched shape was almost vertical, and that the microloading effect was small.

EXAMPLE 12

The microwave plasma processing apparatus shown in FIG. 11 was used to carry out ashing of a photoresist by the following procedure.

As the article W, was used a silicon substrate (φ 8 inches) immediately after a silicon oxide film was etched using a photoresist mask to form via holes. After the substrate was put on the substrate support 2, the plasma generation chamber 9 was evacuated through the evacuation means 8 by the evacuation system (118, 128) to reduce the pressure down to $1.33 \times 10^{-3}$ Pa. Oxygen gas was introduced at a flow rate of 2 slm into the plasma generation chamber 9 through the plasma processing gas introducing port 7. Then, the conductance valve 128 provided in the evacuation system (118, 128) was adjusted to maintain the inside of the plasma generation chamber 9 at 133 Pa. A power of 1.5 kW from the microwave power source 6 of 2.45 GHz was supplied into the plasma generation chamber 9. Thus, a plasma was generated in the plasma generation chamber 9. At this time, the oxygen gas introduced through the plasma processing gas introducing port 7 was excited, decomposed and reacted in the plasma generation chamber 9 to be converted to ozone, which was then transported toward the substrate. The photoresist on the substrate was oxidized by the ozone to be vaporized and removed. After the ashing, the ashing speed, its uniformity and the charge density on the surface of the substrate were evaluated.

The ashing speed and its uniformity obtained was as significantly good as 6.6 μm/min±3.5%, and the surface charge density was as sufficiently low as $-1.3 \times 10^{11}/cm^2$.

EXAMPLE 13

The microwave plasma processing apparatus shown in FIG. 11 was used to form a silicon nitride film serving to protect a semiconductor element by the following procedure.

The article W provided was a P-type single crystal silicon substrate (face orientation <100>; resistivity: 10 Ωcm) with a silicon oxide film on the surface of which an Al wiring pattern (line and space: 0.5 μm) was formed. First, after the article W was put on the substrate support 2, the plasma generation chamber 9 was evacuated via the evacuation means 8 by the evacuation system (118, 128) to reduce the pressure down to $1.33 \times 10^{-5}$ Pa. Subsequently, a heater as the temperature controlling means 11 was energized to heat the silicon substrate to 300° C., and the substrate was maintained at this temperature. Nitrogen gas at a flow rate of 600 sccm and monosilane gas at a flow rate of 200 sccm were introduced through the plasma processing gas introducing port 7 into the plasma generation chamber 9. Then, the conductance valve 128 provided in the evacuation system (118, 128) was adjusted to maintain the inside of the plasma generation chamber 9 at 2.66 Pa. Subsequently, a power of 3.0 kW from the microwave power source 6 of 2.45 GHz was supplied. Thus, a plasma was generated in the plasma generation chamber 9. At this time, the nitrogen gas introduced via the plasma processing gas introducing port 7 was excited and decomposed in the plasma generation chamber 9 to form an active species, which was then transported toward the silicon substrate to react with the monosilane gas, thereby depositing a silicon nitride film in 1.0 μm thickness on the silicon substrate. After the film formation, the film formation speed, its uniformity and the film quality such as stress were evaluated. For the stress, the change in the amount of the warpage of the substrate was measured before and after the film formation using a laser interferometer Zygo (trade name).

The formation speed and its uniformity of the silicon nitride film obtained was as significantly large as 510 nm/min±2.5%, and for the film quality, the stress was $1.2 \times 10^8$ dyne/cm² (compression), the leak current was $1.2 \times 10^{-10}$ A/cm², and the dielectric strength was 9 MV/cm, and the film was therefore confirmed to be very excellent.

EXAMPLE 14

The microwave plasma processing apparatus shown in FIG. 11 was used to form a silicon oxide film and a silicon nitride film serving as an anti-reflection film for a plastic lens by the following procedure.

The article W provided was a plastic convex lens of a diameter 50 mm. After the lens was put on the substrate support 2, the plasma generation chamber 9 was evacuated via the evacuation system (118, 128) to reduce the pressure down to about $1.33 \times 10^{-5}$ Pa.

Nitrogen gas at a flow rate of 160 sccm and monosilane gas at a flow rate of 100 sccm were introduced into the plasma generation chamber 9. Then, the conductance valve 128 was adjusted to maintain the inside of the plasma generation chamber 9 at 0.93 Pa. Subsequently, a power of 3.0 kW from the microwave power source 6 of 2.45 GHz was supplied into the plasma generation chamber 9. Thus, a plasma was generated in the plasma generation chamber 9. At this time, the introduced nitrogen gas was excited and decomposed in the plasma generation chamber 9 to form an active species such as nitrogen atoms, which was then transported toward the lens to react with the monosilane gas, thereby forming a silicon nitride film in a 21 nm thickness on the surface of the lens.

Next, oxygen gas at a flow rate of 200 sccm and monosilane gas at a flow rate of 100 sccm were introduced into the plasma generation chamber 9. Then, the conductance valve 128 was adjusted to maintain the inside of the plasma generation chamber 9 at 0.13 Pa. Subsequently, a power of 2.0 kW from the microwave power source 6 of 2.45 GHz was supplied into the plasma generation chamber 9. Thus, a plasma was generated in the plasma generation chamber 9. At this time, the introduced oxygen gas was excited and decomposed in the plasma generation chamber 9 to form active species such as oxygen atoms, which was then transported toward the lens to react with the monosilane gas, thereby depositing a silicon oxide film in a 86 nm thickness on the lens. After the film formation, the film formation speeds, their uniformities and the reflection characteristics were evaluated.

The film formation speeds and uniformities of the silicon nitride and silicon oxide films as obtained were as good as 320 nm/min±2.0% and 350 nm/min±2.3%, respectively, and for the film quality, the reflectance in the vicinity of 500 nm was 0.3%, with the result that the film was thus confirmed to have very good optical characteristics.

EXAMPLE 15

The microwave plasma processing apparatus shown in FIG. 11 was used to form a silicon oxide film for interlayer insulation of a semiconductor element by the following procedure.

The article W provided was a P-type single crystal silicon substrate (face orientation <100>; resistivity: 10 Ωcm) having formed on the top portion an Al pattern (line and space: 0.5 μm). First, the silicon substrate was put on the substrate support 2. The plasma generation chamber 9 was evacuated to reduce the pressure down to $1.33 \times 10^{-5}$ Pa. Subsequently, the heater was energized to heat the silicon substrate to 300° C., and the substrate was maintained at this temperature. Oxygen gas at a flow rate of 500 sccm and monosilane gas at a flow rate of 200 sccm were introduced into the plasma generation chamber 9. Then, the conductance valve 128 provided in the evacuation system (118, 128) was adjusted to maintain the inside of the plasma generation chamber 9 at 4.0 Pa. Subsequently, a power of 300 W from a high frequency application means of 13.56 MHz was applied to the substrate support 2, while a power of 2.0 kW from the microwave power source 6 of 2.45 GHz was supplied into the plasma generation chamber 9. Thus, a plasma was generated in the plasma generation chamber 9. The introduced oxygen gas was excited and decomposed in the plasma generation chamber 9 to form an active species, which was then transported toward the silicon substrate to react with the monosilane gas, thereby forming a silicon oxide film in the thickness of 0.8 μm on the silicon substrate. At this time, the ion species has a function of being accelerated by the RF bias to be incident upon the substrate and to cut the film on the pattern, thereby improving the flatness of the film. After the processing, the film formation speed, its uniformity, dielectric strength, and step coverage were evaluated. The step coverage was evaluated by observing a cross section of the silicon oxide film formed on the Al pattern with a scanning electron microscope (SEM) to check presence of voids.

The formation speed and uniformity of the silicon oxide film thus obtained was as good as 240 nm/min±2.2%, and the dielectric strength was 8.5 MV/cm and no voids were found. Therefore, the film was confirmed to have good quality.

EXAMPLE 16

The microwave plasma processing apparatus shown in FIG. 11 was used to etch an interlayer insulating film of a semiconductor element by the following procedure.

The article W provided was a P-type single crystal silicon substrate (face orientation <100>; resistivity: 10 Ωcm) having formed on an Al pattern (line and space: 0.18 μm) a silicon oxide film in 1 μm thickness. First, after the silicon substrate was put on the substrate support 2, the plasma generation chamber 9 was evacuated to reduce the pressure down to $1.33 \times 10^5$ Pa. $C_4F_8$ gas at a flow rate of 100 sccm was introduced into the plasma generation chamber 9. Then, the conductance valve 128 provided in the evacuation system (118, 128) was adjusted to maintain the inside of the plasma generation chamber 9 at 1.33 Pa. Subsequently, a power of 300 W from a high frequency application means of 13.56 MHz was applied to the substrate support 2, while a microwave power of 2.0 kW from the microwave power source 6 of 2.45 GHz was supplied into the plasma generation chamber 9. Thus, a plasma was generated in the plasma generation chamber 9. The introduced $C_4F_8$ gas was excited and decomposed in the plasma generation chamber 9 to form an active species, which was then transported toward the silicon substrate, where ions accelerated by a self bias etched the silicon oxide film. A cooler as the temperature controlling means 11 prevented the temperature of the substrate from increasing above 80° C. After the etching, the etch rate, its uniformity, etch selectivity, and etched shape were evaluated. The etched shape was evaluated by using a scanning electron microscope (SEM) to observe a cross section of the etched silicon oxide film.

The etch rate, its uniformity and the etch selectivity to polysilicon were as good as 540 nm/min±2.2% and 20, respectively, and it was confirmed that the etched shape was almost vertical, and that the microloading effect was small.

EXAMPLE 17

The microwave plasma processing apparatus shown in FIG. 11 was used to etch a polyarylether film for interlayer insulation of a semiconductor element by the following procedure.

The article W provided was a P-type single crystal silicon substrate (face orientation <100>; resistivity: 10 Ωcm) having on a polyarylether (PAE) film of 600 nm in thickness a silicon oxide film pattern in 200 nm thickness having a hole of 0.18 μm in diameter formed. First, after the silicon substrate was put on the substrate support 2, the plasma generation chamber 9 was evacuated to reduce the pressure down to $1.33 \times 10^{-5}$ Pa. $NH_3$ gas at a flow rate of 200 sccm was introduced into the plasma generation chamber 9. Then, the conductance valve 128 provided in the evacuation system (118, 128) was adjusted to maintain the inside of the plasma generation chamber 9 at a pressure of 1.33 Pa. Subsequently, a power of 500 W from a high frequency application means of 1.5 MHz was applied to the substrate support 2, while a power of 2.0 kW from the microwave power source 6 of 2.45 GHz was supplied into the plasma generation chamber 9. Thus, a plasma was generated in the plasma generation chamber 9. The introduced $NH_3$ gas was excited and decomposed in the plasma generation chamber 9 to form an active species, which was then transported toward the silicon substrate, where ions accelerated by a self bias etched the PAE film. A cooler as the temperature controlling means 11 was used to lower the temperature of the substrate to −10° C. After the etching, the etch rate, its uniformity, etch selectivity, and etched shape were evaluated. The etched shape was evaluated by using a scanning electron microscope (SEM) to observe a cross section of the etched PAE film.

The etch rate, its uniformity and the etch selectivity to silicon oxide as good as 820 nm/min±3.2% and 40, respectively, and it was confirmed that the etched shape was almost vertical, and that the microloading effect was small.

What is claimed is:

1. A plasma processing apparatus comprising:

a plasma generation chamber;

a support means for supporting an article;

a gas introducing means for introducing a gas into the plasma generation chamber;

an evacuation means for evacuating the plasma generation chamber;

a microwave applicator comprising an endless circular waveguide having two microwave introducing ports provided at an interval of 180° in an upper surface of the circular waveguide and a plurality of slots for supplying microwaves into the plasma generation chamber; and a junction means comprising a single inlet for microwaves connected to a single microwave oscillator and two outlets for microwaves connected to the two microwave introducing ports of the circular waveguide, wherein the circumferential length of the circular waveguide, which is the length of an annulus formed by connecting the centers of cross-sections of the circular waveguide together, is an odd multiple of the guide wavelength, and wherein the junction means is an H-plane junction for distributing microwaves in two directions.

* * * * *